(12) United States Patent
Lakshmi et al.

(10) Patent No.: US 10,592,141 B2
(45) Date of Patent: Mar. 17, 2020

(54) ERROR CHARACTERIZATION FOR CONTROL OF NON-VOLATILE MEMORY

(71) Applicant: Western Digital Technologies, Inc., San Jose, CA (US)

(72) Inventors: Vinay Vijendra Kumar Lakshmi, Bangalore (IN); Raghavendra Gopalakrishnan, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 85 days.

(21) Appl. No.: 15/913,898

(22) Filed: Mar. 6, 2018

(65) Prior Publication Data

US 2019/0278500 A1  Sep. 12, 2019

(51) Int. Cl.
| | |
|---|---|
| G06F 3/06 | (2006.01) |
| G11C 29/44 | (2006.01) |
| G06F 11/10 | (2006.01) |
| G11C 29/52 | (2006.01) |
| G06N 5/04 | (2006.01) |
| G06N 3/12 | (2006.01) |

(52) U.S. Cl.
CPC .......... *G06F 3/0632* (2013.01); *G06F 3/0619* (2013.01); *G06F 3/0659* (2013.01); *G06F 3/0688* (2013.01); *G06F 11/1068* (2013.01); *G06N 3/126* (2013.01); *G06N 5/04* (2013.01); *G11C 29/44* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 7,227,797 | B2* | 6/2007 | Thayer | G06F 11/1044 365/200 |
| 10,403,366 | B1* | 9/2019 | Tabrizi | G11C 11/56 |
| 2008/0301256 | A1* | 12/2008 | McWilliams | G06F 12/0284 709/214 |
| 2016/0217030 | A1* | 7/2016 | Shin | G06F 11/085 |
| 2017/0139761 | A1* | 5/2017 | Song | G06F 11/073 |

OTHER PUBLICATIONS

Lakshmi et al, Architecture Exploration for Embedded Processors, Southeastcon, 2013 Proceedings of IEEE, Apr. 4-7, 2013, IEEE, Jacksonville, FL, USA.
Lakshmi, Design Space Exploration for Embedded Processor Architecture in Emerging Bio-Medical Systems, 2012, Charlotte, NC, USA.

* cited by examiner

*Primary Examiner* — Mujtaba M Chaudry
(74) *Attorney, Agent, or Firm* — Kunzler Bean & Adamson, PC

(57) ABSTRACT

Apparatuses, systems, and methods are disclosed for error characterization for control of non-volatile memory. An apparatus may include an array of non-volatile memory cells and a controller. A controller may be configured to acquire an error characterization for a region of memory. Also, an error characterization may comprise information about one or more types of errors to which a region of memory is susceptible. A controller may be configured to assign a region of memory into a logical group based on an error characterization. Further, a logical group may comprise a plurality of regions of memory. Additionally, a controller may be configured to service a write request by striping data across multiple regions assigned to a logical group.

20 Claims, 16 Drawing Sheets

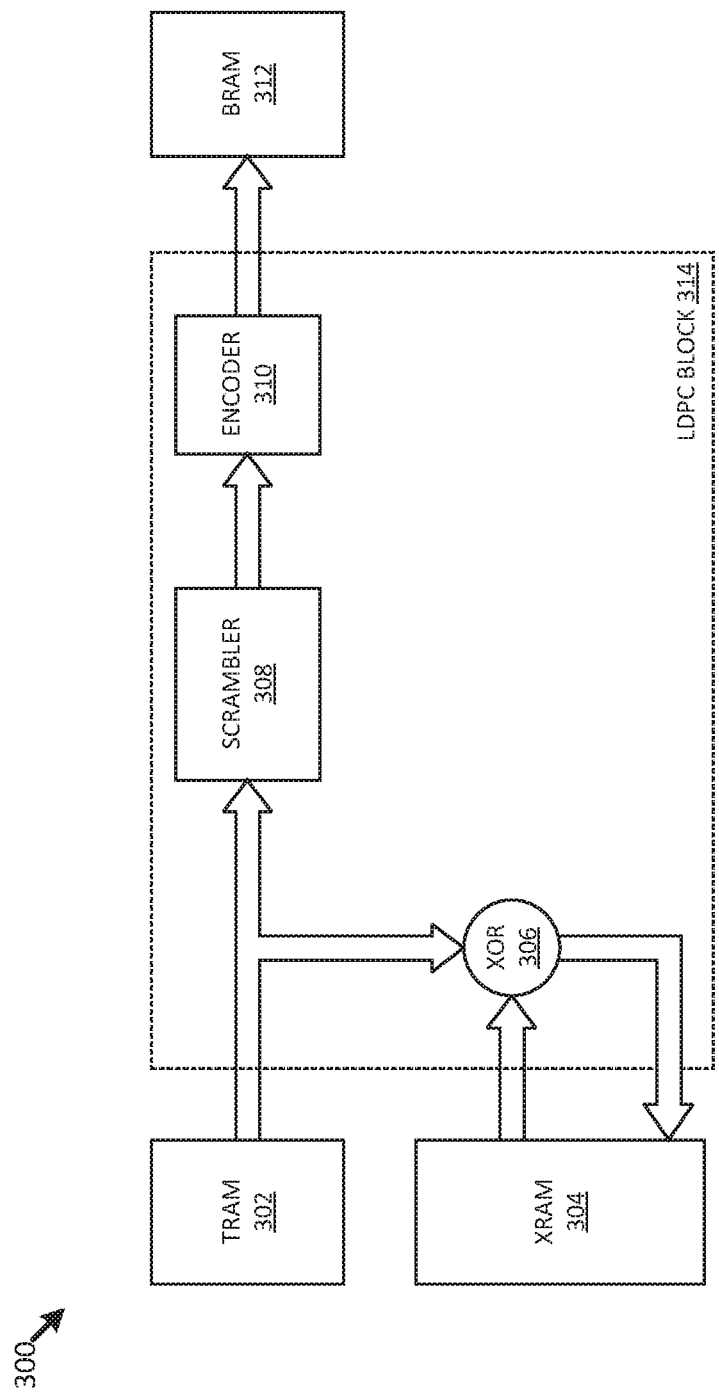

| WL | String | Page | Fim0 Die0 PL0 | Fim0 Die0 PL1 | Fim1 Die0 PL0 | Fim1 Die0 PL1 | Fim2 Die0 PL0 | Fim2 Die0 PL1 | Fim3 Die0 PL0 | Fim3 Die0 PL1 |
|---|---|---|---|---|---|---|---|---|---|---|
| 0 | 0 | 0 | 0 | 36 | 6 | 42 | 12 | 24 | 18 | 30 |
| 0 | 0 | 1 | 1 | 37 | 7 | 43 | 13 | 25 | 19 | 31 |
| 0 | 0 | 2 | 2 | 38 | 8 | 44 | 14 | 26 | 20 | 32 |
| 0 | 1 | 3 | 3 | 39 | 12 | 45 | 15 | 27 | 21 | 33 |
| 0 | 1 | 4 | 4 | 40 | 10 | 46 | 16 | 28 | 22 | 34 |
| 0 | 1 | 5 | 5 | 41 | 11 | 47 | 17 | 29 | 23 | 35 |
| 0 | 2 | 6 | 6 | 42 | 12 | 24 | 18 | 30 | 0 | 36 |
| 0 | 2 | 7 | 7 | 43 | 13 | 25 | 19 | 31 | 1 | 37 |
| 0 | 2 | 8 | 8 | 44 | 14 | 26 | 20 | 32 | 2 | 38 |
| 0 | 3 | 9 | 9 | 45 | 15 | 27 | 21 | 33 | 3 | 39 |
| 0 | 3 | 10 | 10 | 46 | 16 | 28 | 22 | 34 | 4 | 40 |
| 0 | 3 | 11 | 11 | 47 | 17 | 29 | 23 | 35 | 5 | 41 |
| 1 | 0 | 12 | 12 | 24 | 18 | 30 | 0 | 36 | 6 | 42 |
| 1 | 0 | 13 | 13 | 25 | 19 | 31 | 1 | 37 | 7 | 43 |
| 1 | 0 | 14 | 14 | 26 | 20 | 32 | 2 | 38 | 8 | 44 |
| 1 | 1 | 15 | 15 | 27 | 21 | 33 | 3 | 39 | 9 | 45 |
| 1 | 1 | 16 | 16 | 28 | 22 | 34 | 4 | 40 | 10 | 46 |
| 1 | 1 | 17 | 17 | 29 | 23 | 35 | 5 | 41 | 11 | 47 |
| 1 | 2 | 18 | 18 | 30 | 0 | 36 | 6 | 42 | 12 | 24 |
| 1 | 2 | 19 | 19 | 31 | 1 | 37 | 7 | 43 | 13 | 25 |
| 1 | 2 | 20 | 20 | 32 | 2 | 38 | 8 | 44 | 14 | 26 |
| 1 | 3 | 21 | 21 | 33 | 3 | 39 | 9 | 45 | 15 | 27 |
| 1 | 3 | 22 | 22 | 34 | 4 | 40 | 10 | 46 | 16 | 28 |
| 1 | 3 | 23 | 23 | 35 | 5 | 41 | 11 | 47 | 17 | 29 |
| 46 | 0 | 744 | 0 | 36 | 6 | 42 | 12 | 24 | 18 | 30 |
| 46 | 0 | 745 | 1 | 37 | 7 | 43 | 13 | 25 | 19 | 31 |
| 46 | 0 | 746 | 2 | 38 | 8 | 44 | 14 | 26 | 20 | 32 |
| 46 | 1 | 747 | 3 | 39 | 12 | 45 | 15 | 27 | 21 | 33 |
| 46 | 1 | 748 | 4 | 40 | 10 | 46 | 16 | 28 | 22 | 34 |
| 46 | 1 | 749 | 5 | 41 | 11 | 47 | 17 | 29 | 23 | 35 |
| 46 | 2 | 750 | 6 | 42 | 12 | 24 | 18 | 30 | 0 | 36 |
| 46 | 2 | 751 | 7 | 43 | 13 | 25 | 19 | 31 | 1 | 37 |
| 46 | 2 | 752 | 8 | 44 | 14 | 26 | 20 | 32 | 2 | 38 |
| 46 | 3 | 753 | 9 | 45 | 15 | 27 | 21 | 33 | 3 | 39 |
| 46 | 3 | 754 | 10 | 46 | 16 | 28 | 22 | 34 | 4 | 40 |
| 46 | 3 | 755 | 11 | 47 | 17 | 29 | 23 | 35 | 5 | 41 |
| 47 | 0 | 756 | 12 | 24 | 18 | 30 | 0 | 36 | 6 | 42 |
| 47 | 0 | 757 | 13 | 25 | 19 | 31 | 1 | 37 | 7 | 43 |
| 47 | 0 | 758 | 14 | 26 | 20 | 32 | 2 | 38 | 8 | 44 |
| 47 | 1 | 759 | 15 | 27 | 21 | 33 | 3 | 39 | 9 | 45 |
| 47 | 1 | 760 | 16 | 28 | 22 | 34 | 4 | 40 | 10 | 46 |
| 47 | 1 | 761 | 17 | 29 | 23 | 35 | 5 | 41 | 11 | 47 |
| 47 | 2 | 762 | 18 | 30 | 0 | 36 | 6 | 42 | 12 | 24 |
| 47 | 2 | 763 | 19 | 31 | 1 | 37 | 7 | 43 | 13 | 25 |
| 47 | 2 | 764 | 20 | 32 | 2 | 38 | 8 | 44 | 14 | 26 |
| 47 | 3 | 765 | 21 | 33 | 3 | 39 | 9 | 45 | 15 | 27 |
| 47 | 3 | 766 | 22 | 34 | 4 | 40 | 10 | 46 | 16 | 28 |
| 47 | 3 | 767 | 23 | 35 | 5 | 41 | 11 | 47 | 17 | 29 |

FIG. 5

| WL | String | Page | Fim0 Die0 PL0 | Fim0 Die0 PL1 | Fim1 Die0 PL0 | Fim1 Die0 PL1 | Fim2 Die0 PL0 | Fim2 Die0 PL1 | Fim3 Die0 PL0 | Fim3 Die0 PL1 |
|---|---|---|---|---|---|---|---|---|---|---|
| 0 | 0 | 0 | 0 | 12 | 3 | 15 | 6 | 18 | 9 | 21 |
| 0 | 0 | 1 | 1 | 13 | 4 | 16 | 7 | 19 | 10 | 22 |
| 0 | 0 | 2 | 2 | 14 | 5 | 17 | 8 | 20 | 11 | 23 |
| 0 | 1 | 3 | 3 | 15 | 6 | 18 | 9 | 21 | 12 | 0 |
| 0 | 1 | 4 | 4 | 16 | 7 | 19 | 10 | 22 | 13 | 1 |
| 0 | 1 | 5 | 5 | 17 | 8 | 20 | 11 | 23 | 14 | 2 |
| 0 | 2 | 6 | 6 | 18 | 9 | 21 | 12 | 0 | 15 | 3 |
| 0 | 2 | 7 | 7 | 19 | 10 | 22 | 13 | 1 | 16 | 4 |
| 0 | 2 | 8 | 8 | 20 | 11 | 23 | 14 | 2 | 17 | 5 |
| 0 | 3 | 12 | 9 | 21 | 12 | 0 | 15 | 3 | 18 | 6 |
| 0 | 3 | 10 | 10 | 22 | 13 | 1 | 16 | 4 | 19 | 7 |
| 0 | 3 | 11 | 11 | 23 | 14 | 2 | 17 | 5 | 20 | 8 |
| 1 | 0 | 12 | 12 | 0 | 15 | 3 | 18 | 6 | 21 | 9 |
| 1 | 0 | 13 | 13 | 1 | 16 | 4 | 19 | 7 | 22 | 10 |
| 1 | 0 | 14 | 14 | 2 | 17 | 5 | 20 | 8 | 23 | 11 |
| 1 | 1 | 15 | 15 | 3 | 18 | 6 | 21 | 9 | 0 | 12 |
| 1 | 1 | 16 | 16 | 4 | 19 | 7 | 22 | 10 | 1 | 13 |
| 1 | 1 | 17 | 17 | 5 | 20 | 8 | 23 | 11 | 2 | 14 |
| 1 | 2 | 18 | 18 | 6 | 21 | 9 | 0 | 12 | 3 | 15 |
| 1 | 2 | 19 | 19 | 7 | 22 | 10 | 1 | 13 | 4 | 16 |
| 1 | 2 | 20 | 20 | 8 | 23 | 11 | 2 | 14 | 5 | 17 |
| 1 | 3 | 21 | 21 | 9 | 0 | 12 | 3 | 15 | 6 | 18 |
| 1 | 3 | 22 | 22 | 10 | 1 | 13 | 4 | 16 | 7 | 19 |
| 1 | 3 | 23 | 23 | 11 | 2 | 14 | 5 | 17 | 8 | 20 |
| 46 | 0 | 552 | 0 | 12 | 3 | 15 | 6 | 18 | 9 | 21 |
| 46 | 0 | 553 | 1 | 13 | 4 | 16 | 7 | 19 | 10 | 22 |
| 46 | 0 | 554 | 2 | 14 | 5 | 17 | 8 | 20 | 11 | 23 |
| 46 | 1 | 555 | 3 | 15 | 6 | 18 | 9 | 21 | 12 | 0 |
| 46 | 1 | 556 | 4 | 16 | 7 | 19 | 10 | 22 | 13 | 1 |
| 46 | 1 | 557 | 5 | 17 | 8 | 20 | 11 | 23 | 14 | 2 |
| 46 | 2 | 558 | 6 | 18 | 9 | 21 | 12 | 0 | 15 | 3 |
| 46 | 2 | 559 | 7 | 19 | 10 | 22 | 13 | 1 | 16 | 4 |
| 46 | 2 | 560 | 8 | 20 | 11 | 23 | 14 | 2 | 17 | 5 |
| 46 | 3 | 561 | 9 | 21 | 12 | 0 | 15 | 3 | 18 | 6 |
| 46 | 3 | 562 | 10 | 22 | 13 | 1 | 16 | 4 | 19 | 7 |
| 46 | 3 | 563 | 11 | 23 | 14 | 2 | 17 | 5 | 20 | 8 |
| 47 | 0 | 564 | 12 | 0 | 15 | 3 | 18 | 6 | 21 | 9 |
| 47 | 0 | 565 | 13 | 1 | 16 | 4 | 19 | 7 | 22 | 10 |
| 47 | 0 | 566 | 14 | 2 | 17 | 5 | 20 | 8 | 23 | 11 |
| 47 | 1 | 567 | 15 | 3 | 18 | 6 | 21 | 9 | 0 | 12 |
| 47 | 1 | 568 | 16 | 4 | 19 | 7 | 22 | 10 | 1 | 13 |
| 47 | 1 | 569 | 17 | 5 | 20 | 8 | 23 | 11 | 2 | 14 |
| 47 | 2 | 570 | 18 | 6 | 21 | 9 | 0 | 12 | 3 | 15 |
| 47 | 2 | 571 | 19 | 7 | 22 | 10 | 1 | 13 | 4 | 16 |
| 47 | 2 | 572 | 20 | 8 | 23 | 11 | 2 | 14 | 5 | 17 |
| 47 | 3 | 573 | 21 | 9 | 0 | 12 | 3 | 15 | 6 | 18 |
| 47 | 3 | 574 | 22 | 10 | 1 | 13 | 4 | 16 | 7 | 19 |
| 47 | 3 | 575 | 23 | 11 | 2 | 14 | 5 | 17 | 8 | 20 |

FIG. 6

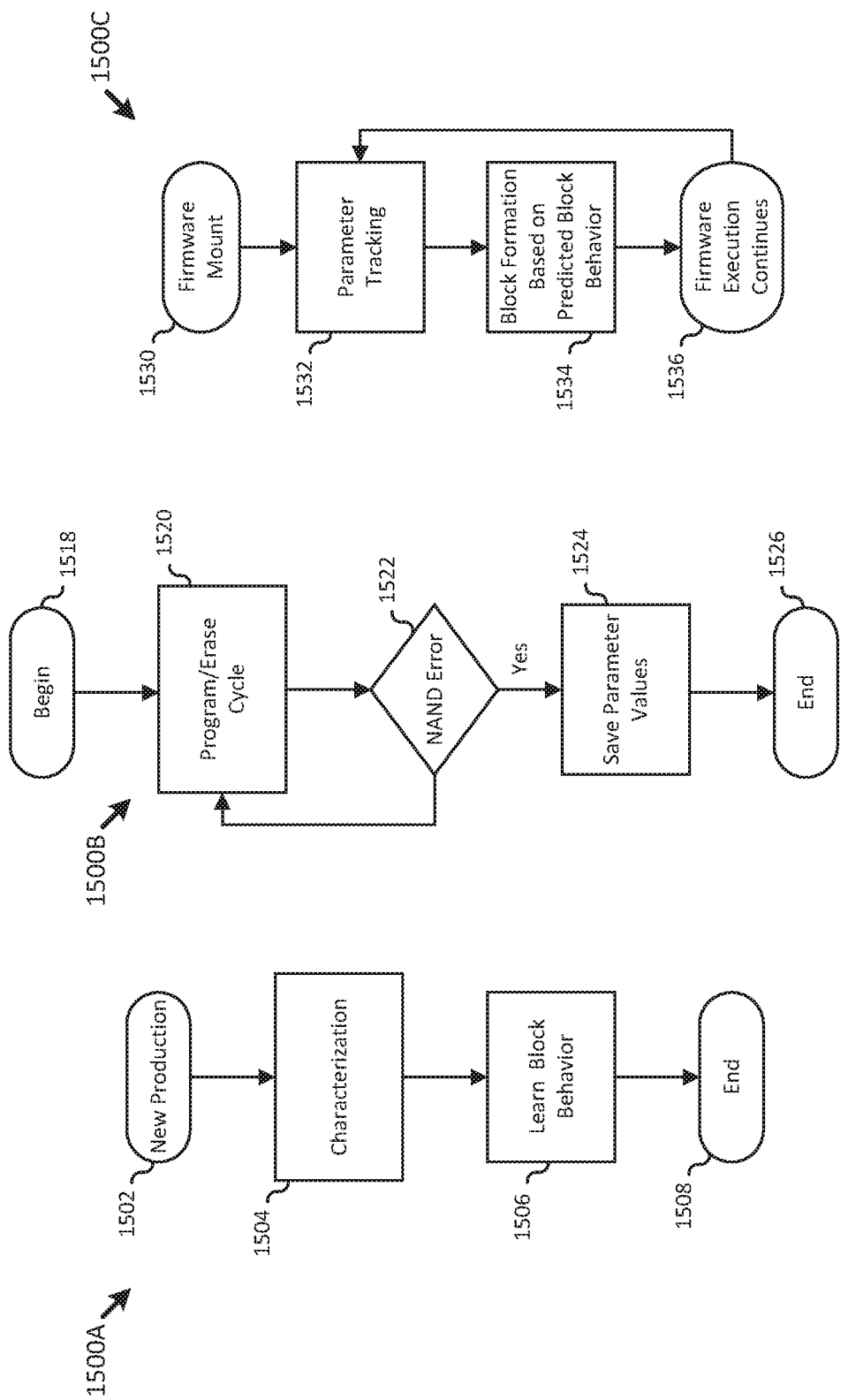

US 10,592,141 B2

ERROR CHARACTERIZATION FOR CONTROL OF NON-VOLATILE MEMORY

TECHNICAL FIELD

The present disclosure, in various embodiments, relates to non-volatile memory and more particularly relates to error characterization for control of non-volatile memory.

BACKGROUND

Various types of memory devices store data in two-dimensional or three-dimensional arrays of memory cells. In certain embodiments, portions of the memory cells are susceptible to errors. To correct errors, memory may store redundant data that can be used to detect or correct the errors as they arise in the different portions of memory. However, allocating memory for redundant data may reduce the overall capacity of a memory device.

SUMMARY

Apparatuses are presented for error characterization for control of non-volatile memory. An apparatus, in one embodiment, includes an array of non-volatile memory cells and a controller. A controller, in one embodiment, is configured to acquire an error characterization for a region of memory. An error characterization, in certain embodiments, indicates one or more types of errors to which a region of memory is susceptible. In a further embodiment, a controller is configured to assign a region of memory into a logical group based on an error characterization. Additionally, a logical group, in one embodiment, includes a plurality of regions of memory. In certain embodiments, a controller is configured to service a write request by striping data across multiple regions assigned to a logical group.

Methods are presented for error characterization for control of non-volatile memory. In one embodiment, a method includes testing a non-volatile memory array. In certain embodiments, a method includes characterizing one or more regions of a non-volatile memory array, based on testing, to identify errors to which a region in the one or more regions is susceptible. In a further embodiment, a method includes allocating memory for error correction based on a characterization of one or more regions of a non-volatile memory array.

An apparatus, in another embodiment, includes means for predicting errors for a plurality of regions of a non-volatile memory array. In a certain embodiment, an apparatus includes means for assigning a plurality of regions to logical groups based on predicted errors. In an additional embodiment, an apparatus includes means for correcting errors in a plurality of regions of a non-volatile memory array based on predicted errors for logical groups.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered limiting of the scope of the disclosure, the disclosure is described and explained with additional specificity and detail through the use of the accompanying drawings, in which:

FIG. 3 is a schematic block diagram illustrating a system for generating parity information for data stored in memory;

FIG. 5 is a diagram illustrating one embodiment of storage for a block of memory in an array of non-volatile memory cells;

FIG. 6 is a diagram illustrating one embodiment of storage for a block of memory in an array of non-volatile memory cells;

FIGS. 15A-15C illustrate schematic flowchart diagrams illustrating at least one embodiment of methods for characterizing errors for a portion of memory in an array of non-volatile memory cells.

DETAILED DESCRIPTION

Figure 1:
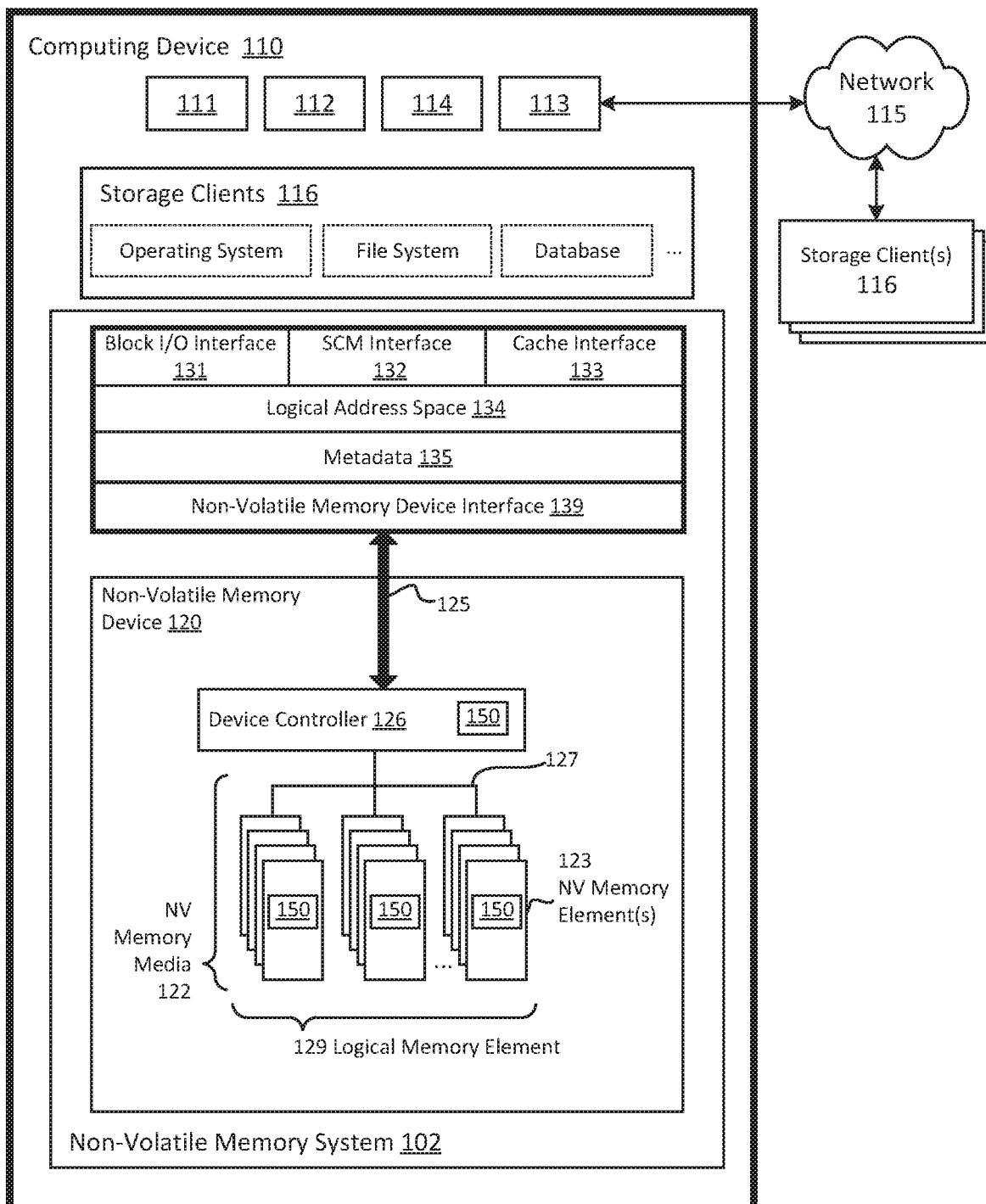
FIG. 1 is a schematic block diagram illustrating one embodiment of a system comprising non-volatile memory elements.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more error characterization components 150 for a non-volatile memory device 120. Error characterization components 150 may be part of one or more non-volatile memory elements 123, a device controller 126 external to the non-volatile memory elements 123, a device driver, or the like. Error characterization components 150 may be part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

The non-volatile memory system 102, in the depicted embodiment, includes one or more error characterization components 150. An error characterization component 150, in one embodiment, may be configured to acquire an error characterization for different regions of memory. When a controller acquires an error characterization, a controller may assign regions of memory into logical groups based on the error characterization. Further, a controller may service a write request by striping data across multiple regions. Further, the controller may allocate different sized portions of memory for error correction. Accordingly, the controller may more efficiently use memory to correct errors. Error characterization components 150 are described in greater detail below with regard to FIGS. 2-11C.

In one embodiment, an error characterization component 150 may include logic hardware of one or more non-volatile memory devices 120, such as a device controller 126, a non-volatile memory element 123, other programmable logic, firmware for a non-volatile memory element 123, microcode for execution by a non-volatile memory element 123, or the like. In another embodiment, an error characterization component 150 may include executable software code, stored on a computer readable storage medium for execution by logic hardware of a non-volatile memory element 123. In a further embodiment, an error characterization component 150 may include a combination of both executable software code and logic hardware.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, a content aware address, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or communication interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the communication interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: resistive random access memory (ReRAM), Memristor memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
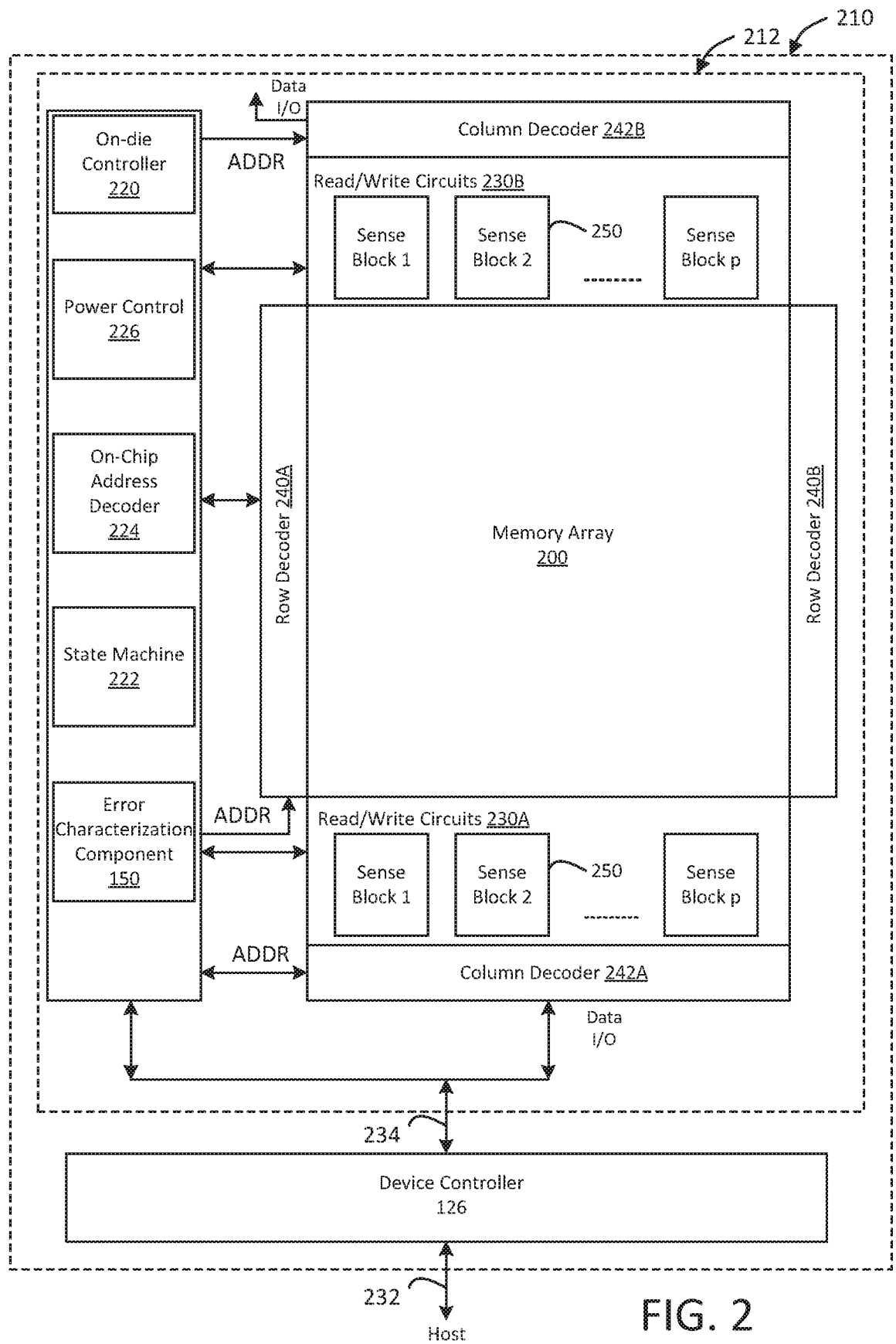
FIG. 2 is a schematic block diagram illustrating another embodiment of a system comprising non-volatile memory elements.

FIG. 2 illustrates an embodiment of a non-volatile storage device 210 that may include one or more memory die or chips 212. A memory die or chip 212 may be a non-volatile memory element 123 as described above with regard to FIG. 1. The non-volatile storage device 210 may be substantially similar to the nonvolatile memory device 120 described with reference to FIG. 1. Memory die 212, in some embodiments, includes an array (two-dimensional or three-dimensional) of memory cells 200, an on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel. In the depicted embodiment, peripheral circuits such as row decoders 240A/240B, column decoders 242A/242B, and read/write circuits 230A/230B are disposed at the edges of the memory array. In another embodiment, however, peripheral circuitry may be disposed above, below, and/or at the sides of a three-dimensional memory array 200.

The memory array 200, in various embodiments, is addressable by word lines via row decoders 240A/240B and by bit lines via column decoders 242A/242B. In some embodiments, a device controller 126 external to the memory die 212 is included in the same memory device 210 (e.g., a removable storage card or package) as the one or more memory die 212. Commands and data are transferred between the host and the device controller 126 via lines 232 and between the device controller 126 and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a state machine 222, an on-chip address decoder 224, a power control circuit 226, and an error characterization component 150, which may be substantially as described above with regard to FIG. 1. In various embodiments, an error characterization component 150 may include or be embodied by an on-die controller 220, a state machine 222, a device controller 126, and/or a device driver.

The state machine 222, in one embodiment, provides chip-level control of memory operations. The on-chip address decoder 224 provides an address interface to convert between the address that is used by the host or a device controller 126 to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of on-die controller 220, power control circuit 226, on-chip address decoder 224, state machine 222, error characterization component 150, decoder circuit 242A, decoder circuit 242B, decoder circuit 240A, decoder circuit 240B, read/write circuits 230A, read/write circuits 230B, and/or device controller 126 can be referred to as one or more managing circuits.

FIG. 3 is a block diagram illustrating at least one embodiment of a system 300 for generating parity information for data stored in memory. As illustrated, the system 300 may include a transfer RAM (TRAM) 302. As used herein, TRAM 302 may include a data buffer that is provisioned for host data caching for host data to/from flash memory. For example, TRAM 302 may be a portion of memory in an SRAM that stores data to be transferred between a host and flash memory. When data is to be written into memory, data transferred from a host may be first stored in TRAM 302 before being stored in memory.

In certain embodiments, parity information may be generated from the data stored in TRAM 302 as data stored in the TRAM 302 is transferred to a buffer RAM (BRAM) 312. As used herein, the parity information may be stored data that can be used to correct errors or reconstruct missing information in memory. For example, the parity information may be used by an error correcting code (ECC) to correct errors. In various embodiments, an error correcting code may be one of various types of error correcting codes, such as a block code, a convolution code, a Bose-Chaudhuri-Hocquenghem (BCH) code, a low-density parity check (LDPC) code, a Hamming code, a Reed-Solomon code, a turbo code, or the like. In a certain embodiment, the ECC may be a systematic error correcting code, so that an ECC chunk, or code word, may store data received by an encoder for the error correcting code, as well as parity bits, or check bits. In an additional embodiment, the parity information may be used by a Boolean XOR function (such as XOR 306) to reconstruct data. While a XOR function is described, the data reconstruction element may store data that can be used by other functionality to correct errors or reconstruct data stored on a memory.

In at least one embodiment, parity information may be generated by a low-density parity check (LDPC) block 314. As shown, the LDPC block 314 may include a scrambler 308 and an encoder 310. As used herein, the scrambler 308 may scramble bits of input data. As used herein, the encoder 310 receives the scrambled bits of input data from the scrambler 308 and computes parity bits using, for example, a parity matrix. The output of the encoder may then be provided to the BRAM 312. As used herein, the BRAM 312 may store data while being used for data handling. Further, the LDPC block 314 may also include a XOR function 306. As used herein, the XOR function 306 may perform a Boolean XOR function of data provided from a TRAM 302 with data stored in an XRAM 304. As used herein, the XRAM 304 may refer to an error correction memory, where the error correction memory is a portion of memory dedicated to storing data for performing error corrections. As illustrated, the XRAM 304 is an example of error correction memory that stores data that is used by a XOR function 306 to correct errors that arise in associated data.

In certain embodiments, the XRAM 304 may be sufficiently large to handle a worst-case scenario for a particular error that occurs in memory associated with the XRAM 304. However, some portions of memory may not be prone to errors that need an XRAM 304 that is sufficiently large enough to handle a possible worst-case scenario. For example, the XRAM 304 may have a size that is proportional to the number of pages that can be affected by a flash operation. For example, certain memory failures associated with the worst-case scenario for memory failures may be correctable using an XRAM 304 that is 48 times a plane page size. Alternatively, other failures may be correctable using an XRAM 304 that is 24 times a plane page size. Accordingly, by handling failures as a potential worst-case scenario, some failures, that can be handled by a smaller XRAM 304, may be handled by the XRAM 304 that is 48 times a plane page size, where less memory may be used to correct certain errors. Thus, the different failures that may occur may be handled by an associated XRAM 304 that has a size that is commensurate with the failure type.

Figure 4A:
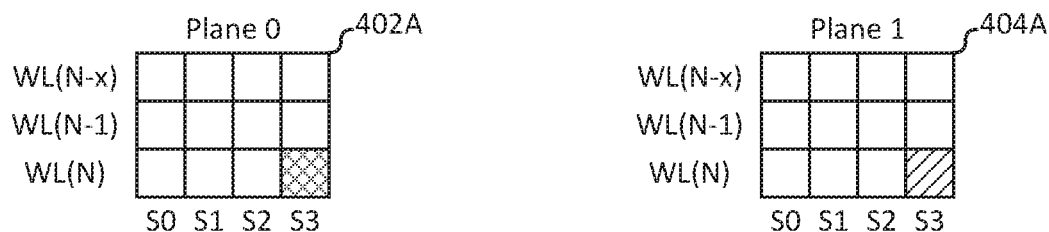
FIGS. 4A-4E are diagrams illustrating different embodiments of errors that may arise in a non-volatile memory cell.
Figure 4B:
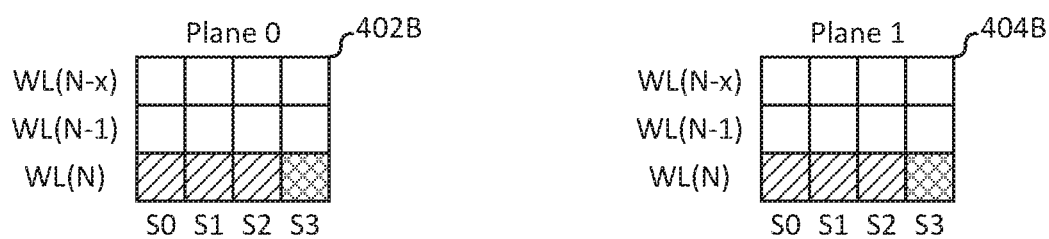

As different errors may be correctable using different sized error correction memory, a controller may identify errors in the regions of memory in a non-volatile memory array such as non-volatile memory array 200. FIGS. 4A-4E are multiple block diagrams that show different types of failures that may occur in different regions of a non-volatile memory like memory array 200. FIG. 4A illustrates a memory failure where a short exists between strings on neighboring planes on a die of memory. As illustrated, a die may include two or more planes of memory, including a first plane 402A and a second plane 404A. In the depicted embodiment, a memory failure is due to cells associated with word line N and string 3 (S3) on both the first plane 402A and the second plane 404A being shorted together. As illustrated, the hatching pattern is different for the first plane 402A and the second plane 404A. In the first plane, the error associated with word line N and string S3 may be experiencing both a program status failure and either an uncorrectable error code correction failure or a short. In the second plane, word line N and string S3 has a different hatching pattern and may be experiencing an uncorrectable error code correction failure or a short. In another example of memory failure, FIG. 4B illustrates a memory failure where word lines on neighboring planes are shorted. As discussed above, a die may include a first plane 402B and a second plane 404B. In this exemplary failure, word line N on both the first plane 402B in the second plane 404B may be shorted together. Further, the cell on word line N and string S3 may be experiencing a program status failure as shown by the different hatching pattern.

Figure 4C:
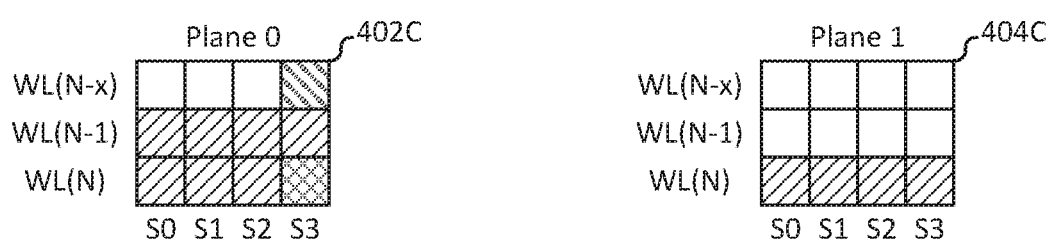
Figure 4D:
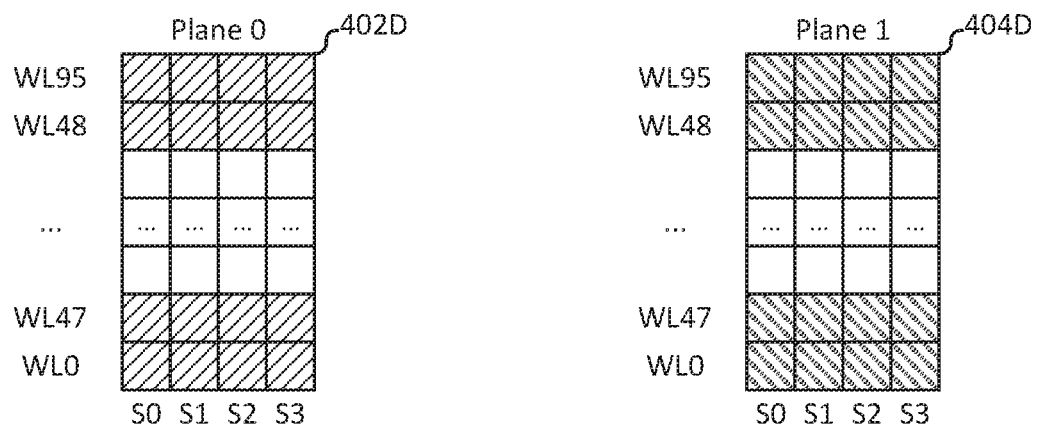
Figure 4E:
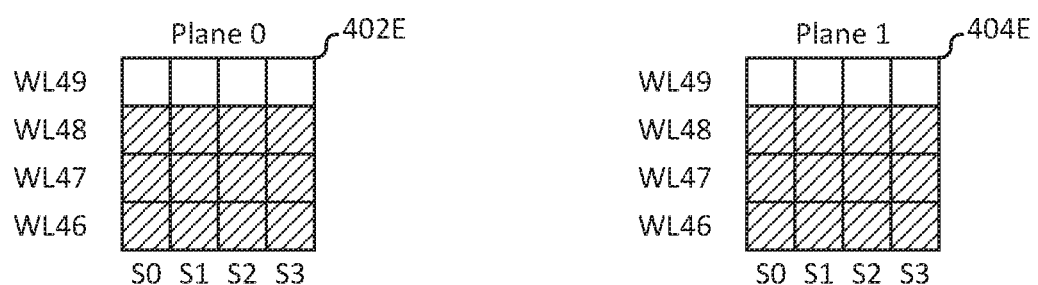

In a further example, FIG. 4C illustrates a memory failure when neighboring word lines fail during programming. For example, two neighboring word lines, word lines N and N−1, on the first plane 402C and word lines N on the second plane 404C may fail during programming as the word lines N on the first planes and word lines N−1 on the first plane experience uncorrectable error code correction failure. Further, word line N and string S3 and both the first plane 402C and second plane 404C may experience a program status failure as represented by the different hatching pattern. Also, word line N−2 and string S3 may experience a possible uncorrectable error code correction failure as shown by the different hatching pattern. FIG. 4D illustrates a memory failure when a word line on the edge of the plane fails during a read. As shown, in this example, word lines on the edge of a plane may experience a failure during a read. As shown, word lines 0, 47, 48, and 95 on both planes 402D and 404D may be located on the edge of a die on separate tiers of a memory element as they experience a failure. Accordingly, word lines 0, 47, 48, and 95 on plane 0 may experience an uncorrectable error code correction failure and word lines 0, 47, 48, and 95 on plane 1 may experience a possible uncorrectable error code correction failure as shown by the different hatching pattern. FIG. 4E illustrates a memory failure when an edge word line around a joint fails during a read. For example, word lines 46-48 may be located around a joint, where a joint joins two tiers of memory holes etched in a memory such as in NAND flash memory, or the like, and one or more unused dummy word lines or buffer word lines may surround each side of the joint. As shown, word lines 46-48 on plane 0 and plane 1 may experience uncorrectable error code correction failures. Interesting A controller may be able to identify an error such as the errors discussed above with regards to FIGS. 4A-4E. As used herein, to identify an error may refer to identifying that an error has occurred and identifying operational parameters associated with the memory experiencing the error.

As shown, in FIGS. 4A-4E, different memory locations on a die of memory may be susceptible to different types of memory failures. Also, different amounts of data may be used to recover from different errors that occur based on the location and type of the error that occurs on a die. For example, a failure of the type illustrated in FIG. 4A may be correctable using an associated XRAM that is 24 times a plane page size. Conversely, other types of failures that occur at other locations on the die may be correctable using an associated XRAM that is 48 times a plane page size. FIGS. 5 and 6 illustrate different storage blocks of XOR storage associated with different error types. For example, FIG. 5 illustrates XOR storage 500 for a block that can handle multiple error types. In contrast, FIG. 6 illustrates XOR storage 600 for a block associated with the error shown in FIG. 4A and FIG. 4B. As shown in FIG. 5, accumulated XOR storage 502 stores 48 pages of accumulated XOR data. Conversely, the XOR storage 600 may include accumulated XOR storage 602, which stores 24 pages of accumulated XOR data. Accordingly, an error associated with XOR storage 600 may use less data to correct errors that arise than the worst-case scenario exhibited by XOR storage 500. As illustrated in FIGS. 5 and 6, the XOR storage included either 24 or 48 pages of XOR data. However, the size of the XOR storage may be a different size from 24 or 48, where the size of the XOR storage is sufficiently large enough to correct errors that arise in the memory associated with the XOR storage.

Figure 7:
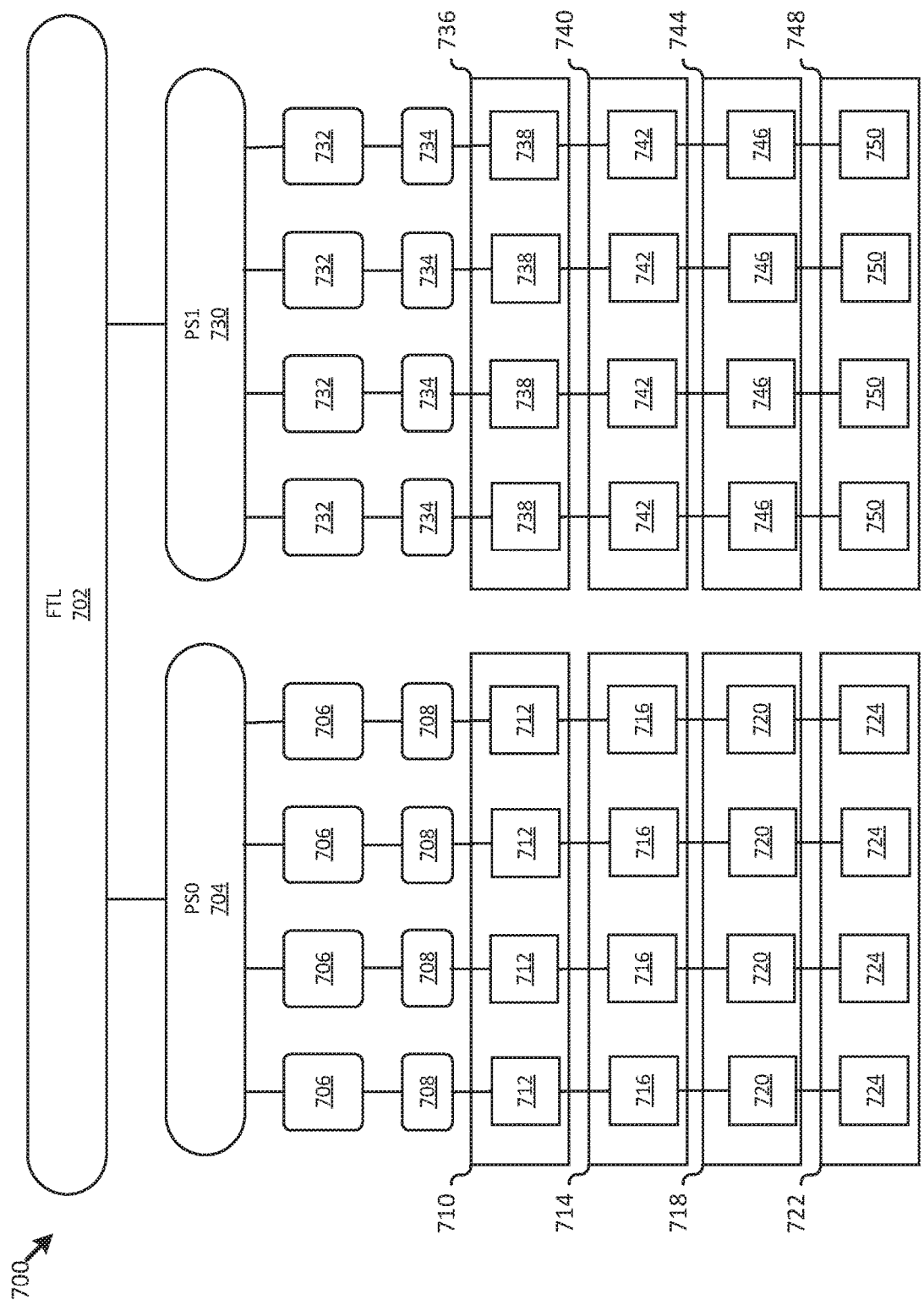
FIG. 7 is a block diagram of one embodiment of metadie selection for an array of non-volatile memory cells.

FIG. 7 illustrates one embodiment of a memory 700 that includes multiple dies associated with multiple channels. In the depicted embodiment, the memory 700 includes multiple metadies. As used herein, a metadie may refer to an arrangement of independently managed sets of non-volatile memory, where an independently managed set may include a whole number of non-volatile memory die that are managed as a single unit by a controller or controller instance. Memory 700, as illustrated, may include metadies 710, 714, 718, 722, 736, 740, 744, and 748. Memory 700 may include a flash translation layer (FTL) 702. In certain embodiments, an FTL 702 may include a data structure that may be used to translate logical addresses (or logical block addresses) of data to physical block addresses of data stored by the memory 700. For example, a host device supporting the memory 700 may utilize logical block addresses of the data stored by memory devices in instructions or messages to the memory 700.

In certain embodiments, the FTL 702 may be configured to communicate with one or more physical storage layer controllers. For example, the FTL 702 communicates with the first physical storage layer controller 704 and a second physical storage layer controller 730. As used herein, a physical storage layer controller may include a controller that controls a physical storage device. As such, the FTL 702 may provide instructions to the one or more physical storage layer controllers 704 and 730 to control a physical storage device. A physical storage layer controller may communicate with one or more associated flash sequencers. For example, the first physical storage layer controller 704 may communicate with a first group of flash sequencers 706 and the second physical storage layer controller 730 may communicate with a second group of flash sequencers 732. As used herein, a flash sequencer may control data transport between the flash memory chips and the FTL. When data is to be written or read from the memory, the flash sequencer may perform operations that facilitate the reading and writing of data to the memory. As illustrated, flash sequencers 706 and 732 may be respectively associated with separate memory channels. As part of interfacing with the memory on the separate memory channel, a flash sequencer may communicate with a flash interface module. For example, flash sequencers 706 communicate with an associated flash interface module 708 and flash sequencers 732 communicate with an associated flash interface module 734. As used herein, a flash interface module may refer to a computer-readable medium storing instructions which a processor may execute to enable communication with a flash memory device. Further, the flash interface module may create one or more logical data paths to the banks of flash memory.

In at least one embodiment, a flash sequencer and flash interface module communicate with an associated channel of memory. As used herein, a memory channel may refer to a section of memory which can be accessed in parallel with other portions of memory. For example, as illustrated, plane storage controllers 704 and 730 may have access to four separate channels of memory die. Channels may be accessed through an associated flash sequencer and a flash interface module. Further, the channels may have four separate memory dies. A plane storage controller 704 and 730 may access dies on separate channels in parallel.

In certain embodiments, a controller, such as device controller 126 or on-die controller 220 described above, may arrange the dies on the different channels into metadies, where a metadie may be an independently managed set of non-volatile memory die that are managed as a single unit by a controller or controller instance. As illustrated, a metadie may include a single die from a channel managed by a separate plane storage controller. For example, a channel in the four channels of memory associated with the first plane storage controller 704 may include a first die 712, a second die 716, a third die 720, and a fourth die 724. Accordingly, a first metadie 710 may include four first dies 712, a second metadie 714 may include four second dies 716, a third metadie 718 may include four third dies 720, and a fourth metadie 722 may include four fourth dies 724. In a similar manner, the four channels of memory associated with the second plane storage controller 730 may include a first die 738, a second die 742, a third die 746, and a fourth die 750. Accordingly, a fifth metadie 736 may include four first dies 738, a sixth metadie 740 may include four second dies 742, a seventh metadie 744 may include four third dies 746 and an eighth metadie 748 may include four fourth dies 750. While the metadies in memory 700 are arranged based on the location of a die within a channel, a metadie may be any set of non-volatile memory dies, where sets are separately managed by a controller. For example, a metadie may include all the dies on a channel, the dies on multiple channels, the first die on one channel and a second die on a separate channel, or other possible arrangements of dies in the memory 700.

Figure 8:
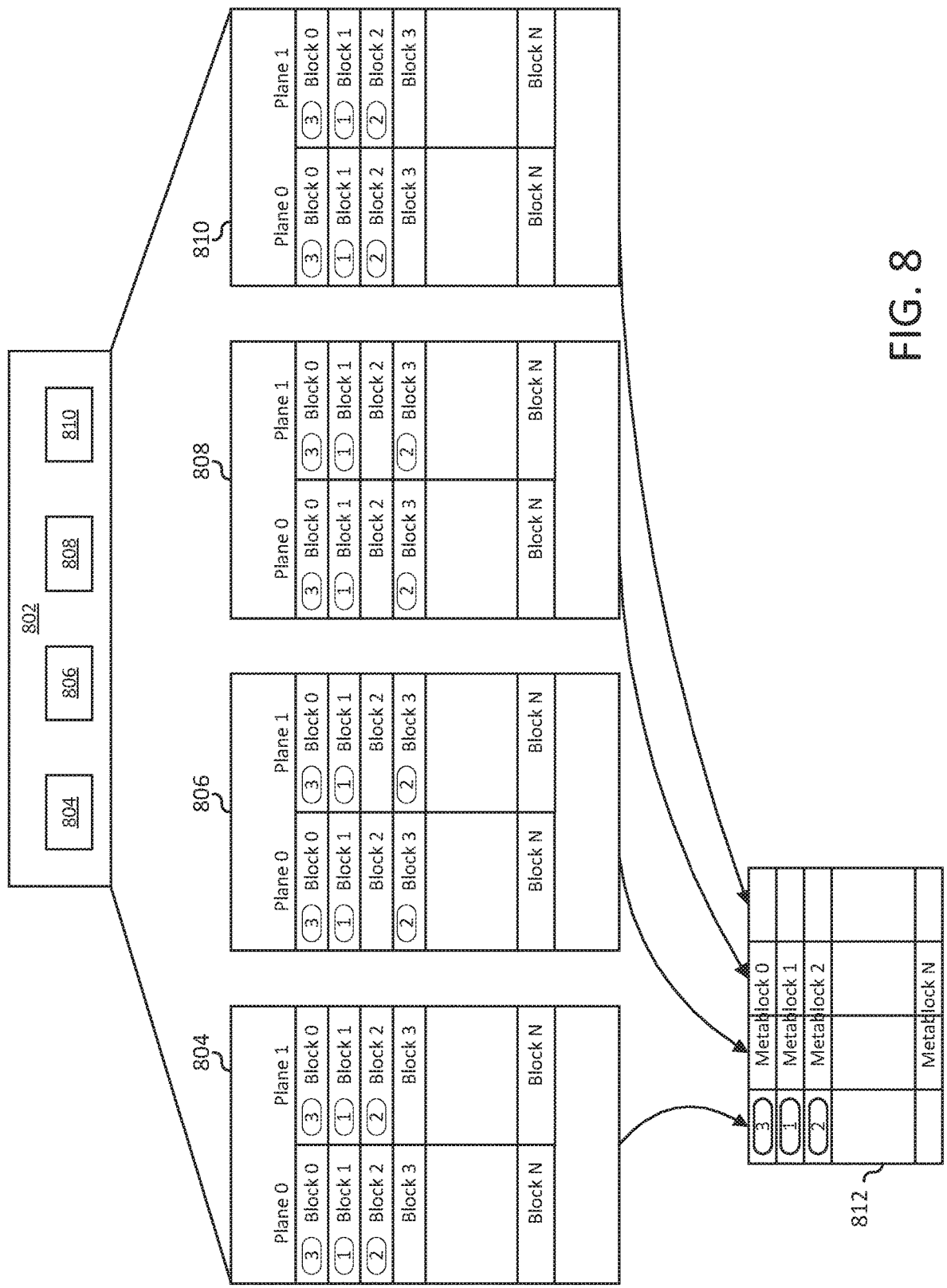
FIG. 8 is a block diagram of one embodiment of logical group formation in an array of non-volatile memory cells.

In at least one embodiment, data on a metadie may be arranged into logical groups that are combinations of different regions of memory. In certain embodiments, a logical group may be referred to as a metablock. As used herein, a metablock may refer to a logical group of memory blocks, where the memory blocks are located on different memory die, where the memory die may be part of the same metadie. In an alternative embodiment, a metablock may be a logical group of memory blocks from different meta die. FIG. 8 illustrates an exemplary embodiment for arranging metablocks 812 from available blocks on a metadie 802. As illustrated, the metadie 802 may include four memory dies, a first memory die 804, a second memory die 806, a third memory die 808, and a fourth memory die 810. As illustrated, memory dies include a first plane and a second plane. The planes may include multiple memory blocks. For example, a plane may include N+1 memory blocks, where a memory block may be a segment of a larger area that can be assigned to store data.

In certain embodiments, blocks located on separate dies may be grouped together to form a metablock, where the blocks are grouped based on a shared characteristic. For example, as illustrated in FIG. 8, blocks having similar program/erase count (PEC) values may be grouped together into the same metablock. As shown, blocks 0 of the separate dies have a PEC value of 3, blocks 1 of the separate dies have a PEC value of 1, blocks 2 of die 804 and die 810 and blocks 3 of die 806 and die 808 have a PEC value of 2. Accordingly, as the blocks 0 have the same PEC value of 3, the blocks 0 may be grouped into the same metablock, in this case metablock 0. Also, as the blocks 1 have the same PEC value of 1, the blocks 1 may be grouped into the same metablock, in this case metablock 1. Further, as the blocks 2 of die 804 and 810 along with blocks 3 of die 806 and die 808 have the same PEC value of 2, the blocks 2 of die 804 and 810 M blocks 3 of die 806 and die 808 may be grouped into the same metablock 2. In such a manner, the N+1 blocks of the dies 804-810 may be grouped into N+1 different metablocks based on a shared characteristic.

Figure 9:
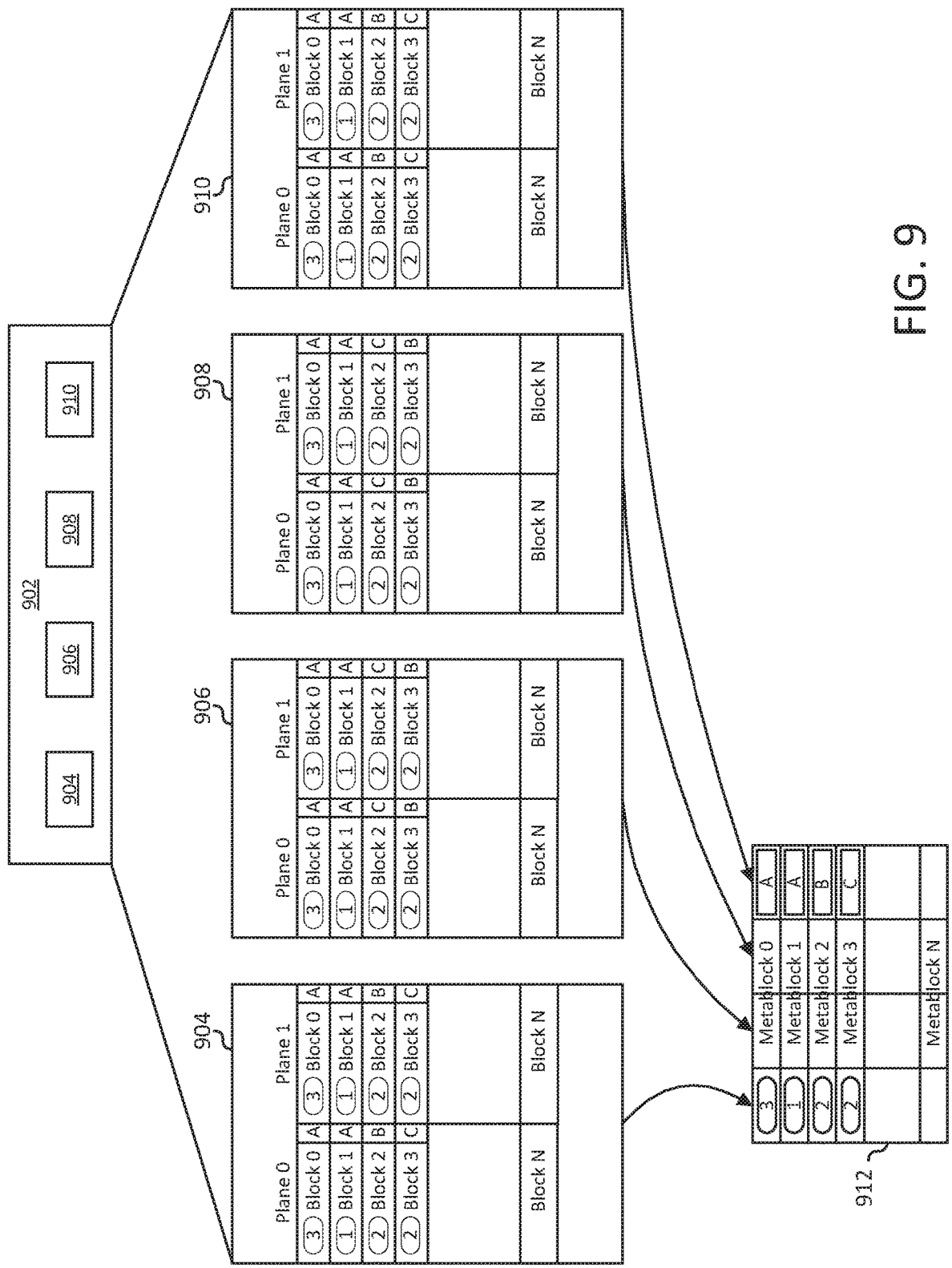
FIG. 9 is a block diagram of a further embodiment of logical group formation in an array of non-volatile memory cells.

FIG. 9 illustrates an exemplary embodiment, for arranging metablocks 912 from available blocks on a metadie 902 based on an error characterization of the available blocks on the dies associated with the metadie 902. As illustrated, the metadie 902 may include four memory dies: a first memory die 904, a second memory die 906, a third memory die 900, and a fourth memory die 910. In a similar manner to metadie 802 described above in relation to FIG. 8, the memory dies in metadie 902 may include a first plane and a second plane, where the planes may include N+1 memory blocks.

In at least one embodiment, blocks located on separate dies may be grouped together for a metablock based on error characterizations for a block. As used herein, an error characterization may be an indication of the type of errors to which cells in a particular block are susceptible. For example, the indication of the type of errors may indicate the likelihood of particular errors, the location of a likely error, and the like. As described above in relation to FIGS. 4A-4E, different locations on dies may be susceptible to different errors. As illustrated in FIG. 9, the blocks on the dies 904-910 have an associated error characterization. For example, blocks 0 and blocks 1 on the multiple dies 904-910 have an error characterization of the type "A". In certain embodiments, the error characterization of type "A" may indicate that the associated block is not prone to errors. Alternatively, the error characterization of type "A" may also indicate that the associated block is prone to a particular type of error or group of errors. When assigning the blocks 0 and blocks 1 to a metablock, further information about the blocks may be used to associate the blocks with one another. For example, while blocks 0 and blocks 1 have the same error characterization they may differ in one or more other characteristics or parameters. As illustrated, blocks 0 have a PEC value of 3 and blocks 1 have a PEC value of 1. Thus, blocks 0 may be associated with one another in metablock 0 of metablocks 912 because of the shared PEC value. Also, blocks 1 may be associated with one another in metablock 1 of metablocks 912.

In contrast to blocks 0 and blocks 1, where the blocks have the same error characterization, blocks 2 on die 904 and die 910 have a different error characterization from blocks 2 on die 906 and die 908. In particular, blocks 2 on die 904 and die 910 have an error characterization of "B" and blocks 2 on die 906 and die 908 have an error characterization of "C". Further, blocks 3 on die 904 and die 910 have a different error characterization from blocks 3 on die 906 and die 908. In particular, blocks 3 on die 904 and die 910 have an error characterization of "C" and blocks 3 on die 906 and die 908 have an error characterization of "B". The metablocks associated with blocks 2 and blocks 3 may be formed based on the error characterizations. For example, a metablock 2 in metablocks 912 may have blocks associated with the error characterization "B" and a metablock 3 in metablocks 912 may have blocks associated with the error characterization "C". Accordingly, metablock 2 may include blocks 2 on die 904 and die 910 and blocks 3 on die 906 and die 908 as these blocks have the same error characterization. Further, metablock 3 may include blocks 2 on die 906 and die 908 and blocks 3 on die 904 and die 910. As the different metablocks have different error characterizations, the size of the memory allocated for the error correction may be different. For example, the metablocks having the error characterization of "A" may have a different sized error correction memory than the metablocks having the error characterization of "B" or "C".

Figure 10:
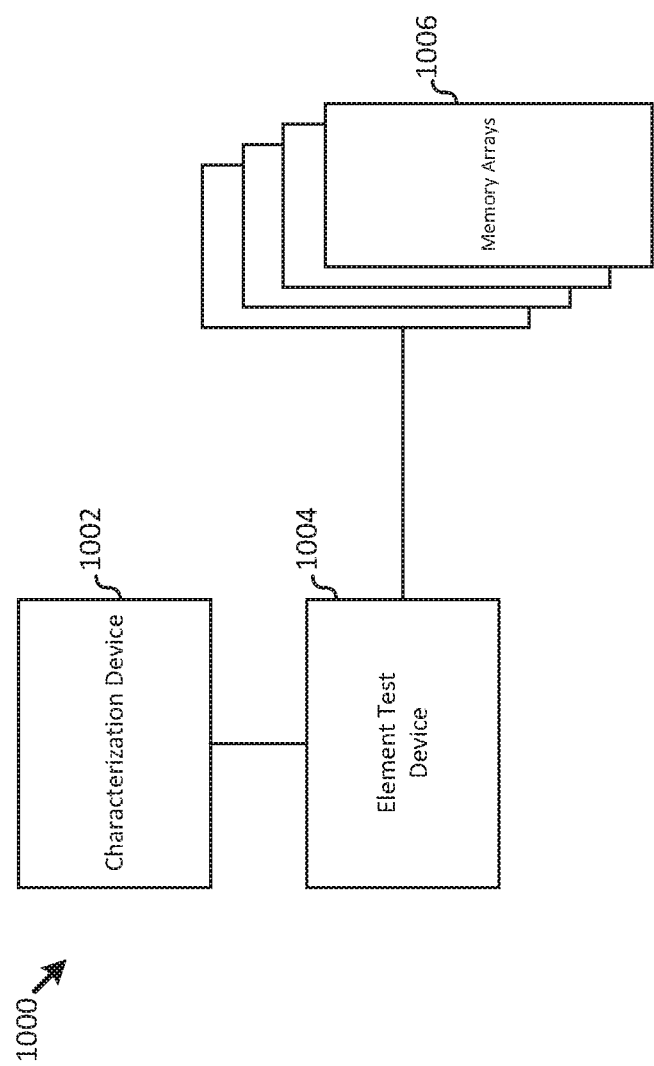
FIG. 10 is a block diagram of one embodiment of a system for characterizing the performance of non-volatile memory elements.

In certain embodiments, to acquire an error characterization for a block of memory a memory element or multiple memory elements may be tested to characterize the memory block's susceptibility to errors. FIG. 10 illustrates a system 1000 for acquiring an error characterization for a plurality of memory arrays 1006. As illustrated, system 1000 includes an element test device 1004. The element test device 1004 may be configured to test multiple non-volatile memory arrays such as the plurality of memory arrays 1006. As used herein, testing a non-volatile memory array may refer to operations performed on a non-volatile memory array to identify and characterize errors that may arise during the operation of a non-volatile memory array. In certain embodiments, to test the plurality of non-volatile memory arrays, the element test device 1004 may run one or more tests to acquire information about the plurality of memory arrays 1006. For example, a production of memory elements may be subjected to a burn up test, where the burn up test may perform multiple program/erase cycles on the various portions of the memory element. Where a program/erase cycle may be the programming of a region of memory with data and the subsequent erasing of the programmed data. During testing, a particular region may be programmed with data and then subsequently erased. The program and erase process may be repeated many times until the region begins to experience errors or the region has been programmed and erased beyond a testing threshold. The element test device 1004 may also perform other operations that may simulate operations that may occur over the lifespan of the memory element.

In a further embodiment, while the burn up test is being performed, the element test device 1004 may identify failures as they occur during the test. When a failure occurs, the element test device 1004 may gather one or more device parameters relating to the state of the memory under test at the time the failure occurred. For example, parameters that may be gathered regarding the state of the memory at the time of failure may include program loop count, applied currents, applied voltages, program and read temperatures, bit error rate values, cell voltage distributions, program voltages, and the like.

In certain embodiments, after the element test device 1004 gathers parameters in response to errors that occurred during the burn up test on the plurality of memory arrays 1006, a characterization device 1002 may characterize the performance of a memory element over the life cycle of the memory element. For example, characterization device 1002 may characterize one or more regions of a non-volatile memory array to identify errors for which the regions in the one or more regions in the non-volatile memory array may be susceptible. In certain embodiments, the characterization device 1002 may use machine learning to predict the behavior of particular regions on the non-volatile memory, where a region may be a block, a page, or other subdivision of a memory array. The characterization device 1002 may use the data gathered by the element test device 1004 during the characterization of a memory element to learn the behavior of the regions on the memory element.

In at least one embodiment, when using the machine learning to learn the behavior, the characterization device 1002 may use a genetically programmed response surface (GPRS) that uses the data gathered during the testing of the plurality of memory arrays 1006. A GPRS, implemented herein, may be an algorithm that operates on a population of possible designs in terms of the parameters discovered during the characterization of the memory elements. In certain implementations, the GPRS may be a polynomial function that maps a subset of the design parameters to a performance measure. Individual designs deemed to provide the most accurate predictions of the characterizations are recombined using a set of evolutionary operators to form new generations of increasingly accurate designs. The evolutionary process of the GPRS may improve the accuracy of a set of predictive designs that indicate which parameters are predictive of errors and the weight of the parameters with respect to a block of memory on the memory element. In certain embodiments, there may be variations in the measured parameters for a particular block. To account for the variations, an average value may be used for the varying parameters. Further, while a GPRS may be used to acquire predictive designs, other machine learning algorithms may be used also to acquire predictive designs that describe potential errors for the blocks of memory. For example, neural networks, genetic algorithms, or other machine learning algorithms may be used. The characterization device 1002 may save the acquired characterization information for use by a controller when memory similar to the memory in the plurality of memory arrays 1006 is mounted within a system.

In a further implementation, when a memory element is characterized, the characterization device 1002 may identify operational parameters for the different regions of memory for a memory array in the plurality of memory arrays 1006 that may contribute to possible errors that may arise for the different regions of memory. As described herein, an operational parameter may refer to a quantifiable value representing the operational state of a region of memory. During the operation of a memory element, the operational parameters may be tracked for the memory device. For example, a controller may track parameters that potentially represent the state of the memory device. In a further embodiment, the characterization device 1002 may also provide weights for different operational parameters, where the weights may indicate a causal relationship between a particular parameter and a likelihood of an error for a particular region on a memory element. As described above, the system 1000 includes a separate testing device 1004 and characterization device 1002, however, testing device 1004 and characterization device 1002 may be part of the same device. Also, some of the functionality ascribed to the testing device 1004 may be performed by the characterization device 1002 and vice versa.

Figure 11C:
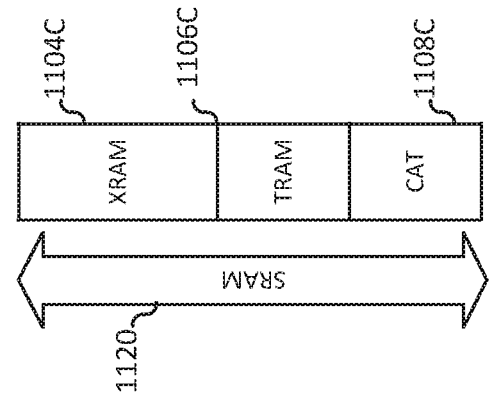
FIGS. 11A-11C are block diagrams illustrating different embodiments of memory layouts based on characterizations of errors for a portion of memory in an array of non-volatile memory cells.
Figure 11B:
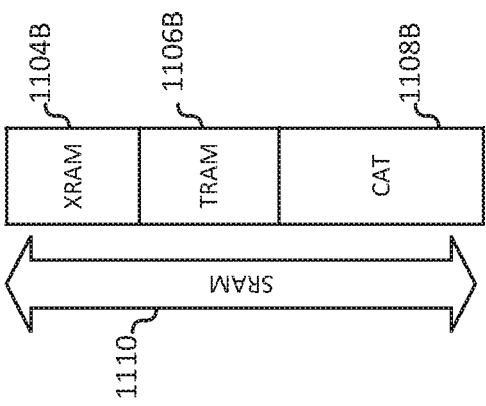
Figure 11A:
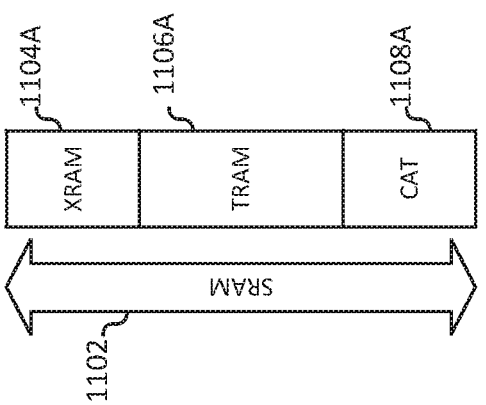

In certain embodiments, FIGS. 11A-11C illustrate different examples of allocating memory for different uses based on predicted block behavior. In particular, FIGS. 11A-11C may illustrate the allocation of memory in a static RAM into an XRAM, a TRAM, and a cached access table (CAT). A XRAM and a TRAM may be similar to the XRAM 304 and the TRAM 302 described above with respect to FIG. 3. The CAT may be a table of logical to physical mappings residing in the cache, or the like. FIGS. 11A and 11B illustrate different examples of allocating memory when the blocks that are susceptible to the type of error described above with relation to FIG. 4A are grouped together. A block susceptible to the type of error described above with relation to FIG. 4A may be correctable using less data than is needed for other types of errors. Accordingly, memory allocated for error correction may have a different size that is based on the error characterization. For example, an XRAM may be smaller for blocks that are susceptible to the particular error of FIG. 4A than for an XRAM for other blocks that are susceptible to other errors. As the XRAM is smaller, a CAT or a TRAM may be increased in size. For example, FIG. 11A illustrates the allocation of an SRAM 1102. As illustrated the SRAM 1102 includes an XRAM 1104A, a TRAM 1106A, and a CAT 1108A. In the SRAM 1102, an XRAM 1104A may use 24 XOR bins, which is described above with relation to FIG. 6. As the XRAM 1104A is smaller, more data may be portioned for the TRAM 1106A. As the TRAM 1106A is increased, data may be written to the blocks associated with the error of FIG. 4A at a faster rate. Alternatively, as illustrated in FIG. 11B, where an SRAM 1110 includes an XRAM 1104B, a TRAM 1106B, and a CAT 1108B, more data may be portioned for the CAT 1108B. As the size of the CAT 1108B is increased, the random read performance of blocks associated with the error of FIG. 4A may be improved. In contrast to FIGS. 11A and 11B, FIG. 11C illustrates an SRAM 1120 for a block of memory that is susceptible to errors other than the error described in FIG. 4A, such as the errors described in FIGS. 4B-4E. As illustrated the SRAM 1120 includes an XRAM 1104C, a TRAM 1106C, and a CAT 1108C. The block of memory associated with SRAM 1120 may be susceptible to errors that are correctable by an XRAM 1104C that is larger than the XRAM illustrated in XRAM 1104A and 1104B. For example, the XRAM may use 48 XOR bins, such as the memory described above with relation to FIG. 5. Accordingly, further data may not be apportioned to the TRAM 1106C or the CAT 1108C. As such, by allocating memory blocks for different purposes based on an error characterization, the performance of the memory may be improved for blocks of memory that are correctable using less XOR data.

Figure 12:
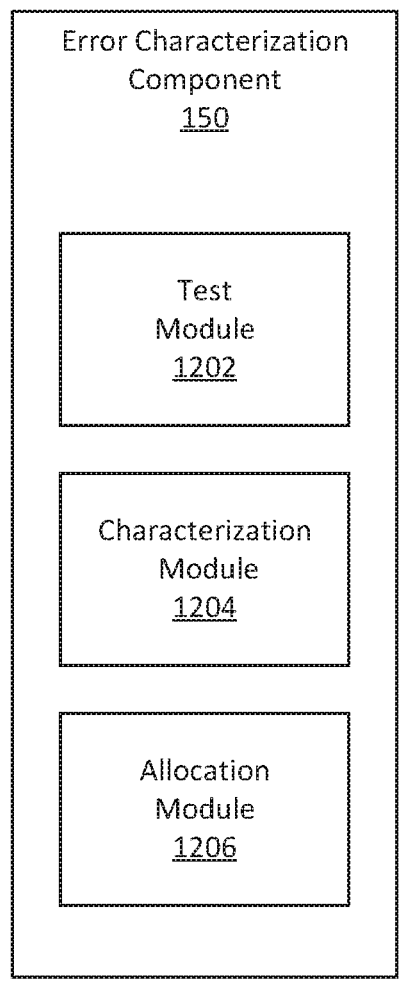
FIG. 12 is a schematic block diagram illustrating one embodiment of an error characterization component.

FIG. 12 depicts one embodiment of an error characterization component 150. The error characterization component 150 may be substantially similar to the error characterization component 150 described above with regards to FIGS. 1-11. In general, as described above, the error characterization component 150 may be configured to acquire error characterizations for regions of memory, where an error characterization may include information about different types of errors for which a region of memory is susceptible. Further, the error characterization component 150 may be configured to assign regions of memory into logical groups based on an acquired error characterization. As used herein, a logical group may include multiple regions of memory. In the depicted embodiment, the error characterization component 150 includes a test module 1202, a characterization module 1204, and an allocation module 1206. In various embodiments, a controller, such as an on-die controller 220 for a single non-volatile memory element 123, a device controller 220 for a device comprising one or more non-volatile memory elements 123, a device driver comprising executable code stored on a computer-readable storage medium, a characterization device 1002, an element test device 1004, or the like, may include the test module 1202, the characterization module 1204, and the allocation module 1206.

The test module 1202, in one embodiment, is configured to test one or more non-volatile memory elements. For example, the test module 1202 may be configured to test multiple non-volatile memory arrays such as the plurality of memory arrays 1006 in FIG. 10. Alternatively, the test module 1202 may be configured to test a memory element or portion of a memory element. In certain embodiments, to test the plurality of non-volatile memory arrays, the test module 1202 may run one or more tests to acquire information about a plurality of memory elements. For example, the test module 1202 may subject a production of memory elements to a burn up test, where the burn up test may perform multiple program/erase cycles on different regions of the memory elements. During testing, a particular region may be programmed with data and then subsequently erased many times until the region begins to experience errors or the region has been programmed and erased beyond a testing threshold. Alternatively, the test module 1202 may perform environmental tests such as temperature, radiation, and the like. The test module 1202 may also perform other operations that may simulate operations and events that may occur over the lifespan of the memory element.

In a further embodiment, while the test module 1202 performs the burn up test, the test module 1202 may also identify failures as they occur during the test. When a failure occurs, the test module 1202 may gather one or more device parameters relating to the state of the memory under test at the time the failure occurred. For example, the test module 1202 may gather parameters that include program loop count, applied currents, applied voltages, program and read temperatures, bit error rate values, cell voltage distributions, program voltages, and the like. The test module 1202 may save the gathered parameters for use by other devices that may use memory similar to the memory under test.

The characterization module 1204, in one embodiment, is configured to characterize the operation of a memory element based on data gathered during a test of the non-volatile memory arrays. In certain embodiments, using the data gathered by the test module 1202, the characterization module 1204 may identify errors for which a region on a non-volatile memory element is susceptible.

In certain embodiments, after the test module 1202 gathers data during a test of the operation of one or more memory elements, a characterization module 1204 may use the gathered data to characterize the performance of a memory element over the life cycle of the memory element. For example, the characterization module 1204 may characterize one or more regions of a non-volatile memory array to identify errors for which the regions in the one or more regions in the non-volatile memory array may be susceptible, where a region may be a block, a page, a word line, or other subdivision of memory. In certain embodiments, the characterization module 1204 may use the data gathered by the test module 1202 to learn the behavior of the regions on the memory element during operation of the memory element. To learn the behavior, the characterization module 1204 may use machine learning to predict the behavior of particular regions of the non-volatile memory.

In at least one embodiment, when using the machine learning to learn the behavior, the characterization module 1204 may use a GPRS that uses the data gathered by the test module 1202. As described above, the GPRS may be an algorithm that operates on a population of possible memory element designs in terms of the parameters monitored by the test module 1202. In certain implementations, the GPRS may be a polynomial function that maps a subset of the design parameters to a performance measure. Individual designs deemed to provide the most accurate predictions of the characterizations are recombined using a set of evolutionary operators to form new generations of increasingly accurate designs. The evolutionary process of the GPRS may improve the accuracy of a set of predictive designs that indicate which parameters are predictive of errors and the weight of parameters with respect to a block of memory on the memory element. In certain embodiments, there may be variations in the measured parameters for a particular block. To account for the variations, an average value may be used for the varying parameters. Further, while the characterization module 1204 may use a GPRS to acquire predictive designs for the memory element, the characterization module 1204 may use other machine learning algorithms to acquire predictive designs that describe potential errors for the blocks of memory. For example, the characterization module 1202 may use neural networks or other machine learning algorithms. The characterization module 1204 may save the acquired characterization information for use by a controller when memory similar to the memory in the plurality of memory arrays 1006 is mounted within a system.

In a further implementation, the characterization module 1204 may identify operational parameters for the different regions of memory that may contribute to possible errors that may arise for the different regions of memory. In a further embodiment, the characterization module 1204 may also provide weights for different operational parameters, where the weights may indicate a causal relationship between a particular parameter and a likelihood of an error for a particular region on a memory element. For example, the characterization module 1204 may give greater weight to the location of a region for some regions and give greater weight to the age of the memory for other regions. The characterization module 1204 may then provide a predictive design for a memory element that describes, on a region by region basis, the susceptibility of the different regions of the memory element to errors.

The characterization module 1204, in one embodiment, is configured to characterize the operation of a memory element based on data gathered during a test of the non-volatile memory arrays. In certain embodiments, using the data gathered by the test module 1202, the characterization module 1204 may identify errors for which a region on a non-volatile memory element is susceptible.

The allocation module 1206, in one embodiment, is configured to allocate memory for error correction based on the characterization of the regions of the non-volatile memory array. In certain embodiments, using the characterization provided by the characterization module 1204, the allocation module 1206 may additionally assign regions of memory into logical groups, where the regions in a logical group may have similar error characterizations. In certain embodiments, a logical group may include a plurality of regions of memory. When the regions of memory are assigned into different logical groups, the allocation module 1206 may allocate memory for correcting errors to the logical groups. In an alternative embodiment, using the characterization provided by the characterization module 1204, the allocation module 1206 may allocate memory to a region of memory for error correction, where the size of the allocated memory is sufficiently large enough to correct the predicted errors for the region of memory.

In certain embodiments, where the allocation module 1206 assigns regions of memory into logical groups, the allocation module 1206 may assign a region, such as a block of memory, into a metablock, where a metablock may be a logical grouping of separate regions of memory having a similar error characterization. In certain embodiments, a metablock may include separate regions of memory from the same memory element. Alternatively, a metablock may include separate regions of memory from separate memory elements. For example, a metablock may include a logical grouping of separate blocks from separate memory die. In certain embodiments, where multiple regions have the same error characterization and the size of the multiple regions exceeds the size of a logical metablock, other characteristics may be used to assign the regions of memory to different metablocks. For example, regions of memory having the same error characterization may be further distinguished from one another based on similar PEC values. As stated above, other characteristics may also be used to further distinguish regions of memory having the same error characterization.

In certain embodiments, when allocation module 1206 has grouped different regions of memory into different logical groups based on error characterizations, the allocation module 1206 may allocate error correction memory to the different logical groups. For the logical groups, the size of the error correction memory may be sufficiently large to correct the errors predictive by the error characterization. For example, if the error characterization of the logical group predicts that the logical group may experience errors similar to the error represented above with respect to FIG. 4A, the allocation module 1206 may allocate 24 bins of XOR memory for correcting errors that arise in connection with the logical group. Alternatively, if the error characterization of the logical group predicts the logical group may experience errors similar to the error represented above with respect to FIG. 4B, the allocation module 1206 may allocate 48 bins of XOR memory for errors that arise in connection with logical group. In certain embodiments, the allocation module 1206 may change logical groupings and memory allocations as the memory advances through the memory life cycle as dictated by the error characterizations provided by the characterization module 1204.

In at least one embodiment, where the allocation module 1206 allocates error correction memory to regions of memory without assigning the different regions to logical groups, the allocation module 1206 may identify a region of memory, where portions of the region may have different error characterizations. When portions of the region have different error characterizations, the allocation module 1206 may allocate sufficient error correction memory to correct a predicted worst-case scenario for a portion of the region. For example, for one region of memory, the worst-case scenario for a portion may be similar to the error represented above in FIG. 4A. For this region of memory, the allocation module 1206 may allocate 24 bins of XOR memory for correcting errors that arise in the region. In a second region, the worst-case scenario for a portion may be similar to the error represented above in FIG. 4B. For this region of memory, the allocation module 1206 may allocate 48 bins XOR memory for correcting errors that arise in the second region.

Figure 13:
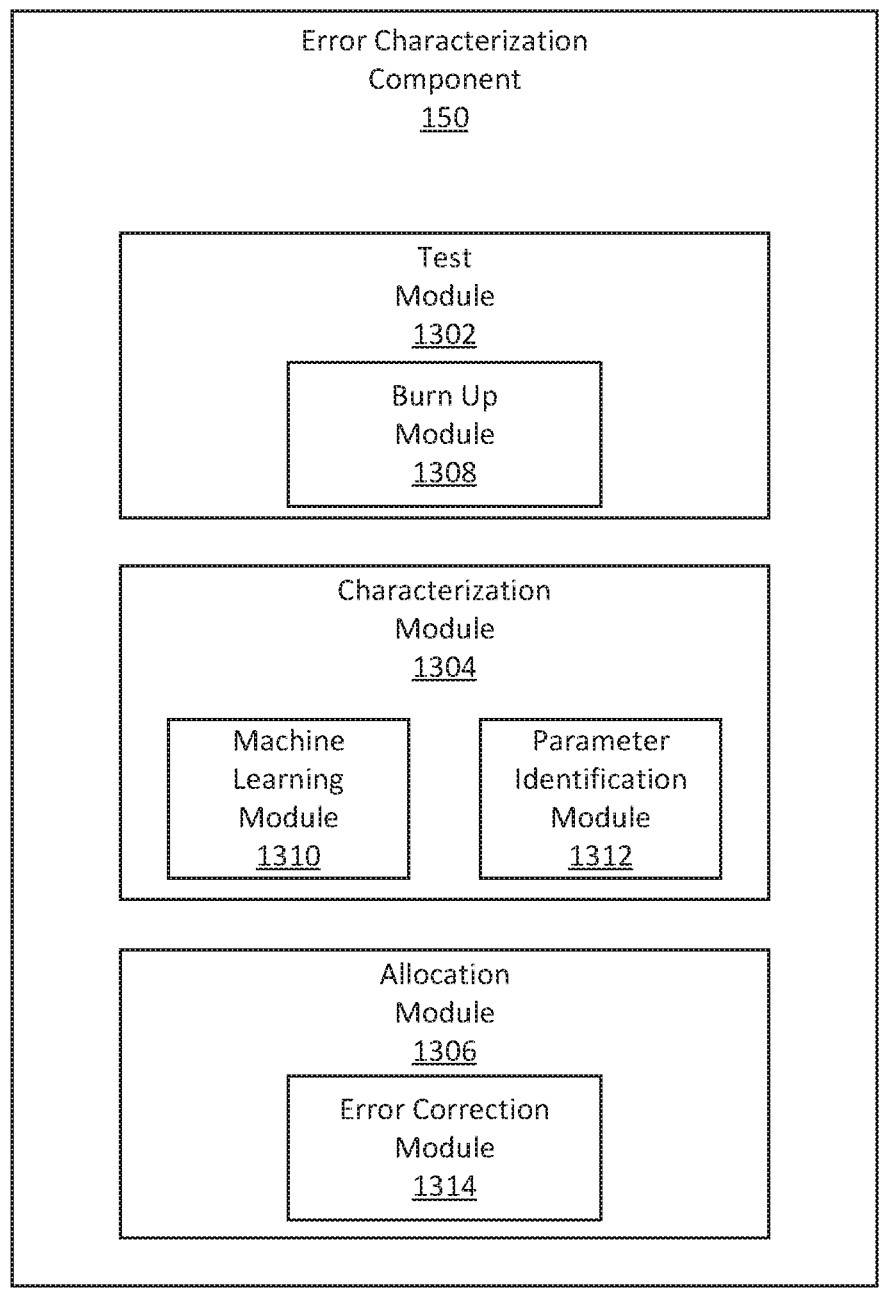
FIG. 13 is a schematic block diagram illustrating another embodiment of an error characterization component.

FIG. 13 depicts another embodiment of an error characterization component 150. The error characterization component 150, in various embodiments, may be substantially similar to the error characterization component 150 described above with regards to FIGS. 1-12. In the depicted embodiment, the error characterization component 150 includes a test module 1302, a characterization module 1300, and an allocation module 1306, which may be configured substantially as described above with regards to FIG. 12. The test module 1302, in the depicted embodiment, further includes a burn up module 1308. The characterization module 1304, in the depicted embodiment, further includes a machine learning module 1310 and a parameter identification module 1312. The allocation module 1306, in the depicted embodiment, further includes an error correction module 1314.

The burn up module 1308, in one embodiment, is configured to perform tests on one or more memory elements that simulate a life cycle of an element. For example, the test module 1202 may subject a production of one or more memory elements test that performs multiple program/erase cycles on the multiple regions of the memory elements. During testing, a particular region may be programmed with data and then subsequently erased many times until the region begins to experience errors or the region has been programmed and erased beyond a testing threshold. In certain implementations, the testing threshold may represent the number of program/erase cycles expected during the useful life of the memory element. In at least one embodiment, the burn up module 1308 may program and erase multiple regions until the cumulative effect of errors from the multiple regions causes the memory element to be inoperable for the intended use of the memory element. Alternatively, the burn up module 1308 may perform environmental tests such as exposing the memory element to extremes in temperature, exposing the memory element to radiation, and other environmental factors. The burn up module 1202 may also perform other operations that may simulate operations and events that may occur over the lifespan of the memory element.

The machine learning module 1310, in one embodiment, is configured to use machine learning to predict errors for regions of memory based on data acquired by the test module 1302 while the burn up module 1308 tested the operation of one or more memory elements. In at least one embodiment, the machine learning module 1310 may use the data acquired by the test module 1302 in a GPRS to predict errors for regions of memory. As described previously, the GPRS may algorithmically operate on a population of possible memory element designs defined by the parameters identified by the test module 1302. In certain implementations, the machine learning module 1310 may use a polynomial function to map a subset of the design parameters to a performance measure. The machine learning module 1310 may identify the most accurate characterizations of the memory elements. The machine learning module 1310 may use evolutionary operators to combine the most accurate characterizations to form increasingly accurate characterizations. Further, the machine learning module 1310 may use other machine learning algorithms to acquire predictive designs that describe potential errors for the blocks of memory. For example, the machine learning module 1310 may use neural networks or other machine learning algorithms. By using machine learning, the machine learning module 1310 may be able to provide accurate characterizations of a memory element.

The parameter identification module 1312, in one embodiment, is configured to identify parameters that are associated with errors predicted by the characterization produced by the machine learning module 1310. Further, the parameter identification module 1312 may provide weights for different operational parameters, where the weights may indicate a causal relationship between a particular parameter and a likelihood of an error for a particular region on a memory element. The characterization module 1304 may provide the identified parameters as well as the design produced by the machine learning module 1310 to a controller, where the controller may use the information provided by the characterization module 1304 to more efficiently use the memory as described above with regards to FIGS. 11A-11C.

The error correction module 1314, in one embodiment, is configured to identify one or more errors in a region of memory and attempt to correct the errors. After, an element has been characterized, a memory element similar to the characterized element may be used to store data for a host device. When installed within a host device, the error correction module 1314 may track the operational parameters that may be predictive of errors and that represent the state of the memory device. While tracking the parameters, the error correction module 1314 may use the error correction memory for the regions that was allocated by the allocation module 1306 to correct errors that arise within the respective regions of memory. As the size of the error correction memory may be different for the separate regions, the error correction module 1314 may be able to more efficiently use the error correction module 1314.

Figure 14:
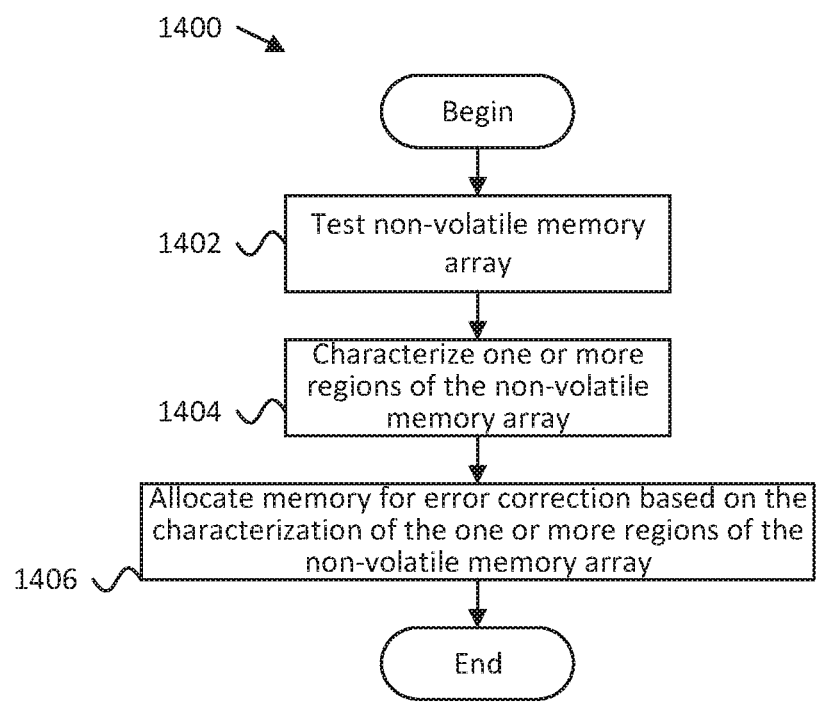
FIG. 14 is a schematic flow chart diagram illustrating one embodiment of a method for error characterization for control of non-volatile memory.

FIG. 14 depicts one embodiment of a method 1400 for error characterization for control of non-volatile memory. The method 1400 begins, and the test module 1202 tests 1402 a non-volatile memory array. The characterization module 1204 characterizes 1404 one or more regions of the non-volatile memory array. The allocation module 1206 allocates 1406 memory for error correction based on the characterization of the one or more regions of the non-volatile memory array, and the method 1400 ends.

FIGS. 15A-15B illustrate flow diagrams for characterizing errors that may arise on a block of memory. For example, FIG. 15A illustrates a method 1500 for characterizing errors that may arise on a region of memory. Method 1500 may begin at 1502 with a new production of a memory elements that have yet to be characterized and tested for errors. Alternatively, the method 1500 may also be used to characterize other memory elements that may be used. Method 1500 may then proceed to 1504, where the newly produced memory elements are tested through a characterization test. The characterization test may run one or more tests to acquire information about the memory elements. For example, a production of memory elements may be subjected to a burn up test, where the burn up test may perform multiple program/erase cycles on the various portions of the memory element. The burn up test may also perform other operations that may simulate operations that occur over the lifespan of the memory element.

In certain embodiments, the method 1500A proceeds at 1506, where block behavior is learned. A testing device may use the data gathered during the characterization of a memory element to learn the behavior of the blocks on the memory element. In at least one embodiment, the testing device may use a machine learning method to learn behavior of the blocks of the memory element. For example, the testing device may implement a GPRS using the data gathered during the characterization of the memory element. A GPRS, implemented herein, may be an algorithm that operates on a population of possible designs in terms of the parameters discovered during the characterization of the memory elements. In certain implementations, the GPRS may be a polynomial function that maps a subset of the design parameters to a performance measure. Individual designs deemed to provide the most accurate predictions of the characterizations are recombined using a set of evolutionary operators to form new generations of increasingly accurate designs. The evolutionary process of the GPRS may improve the accuracy of a set of predictive designs that indicate which parameters are predictive of errors and the weight of the parameters with respect to a block of memory on the memory element. In certain embodiments, there may be variations in the measured parameters for a particular block. To account for the variations, an average value may be used for the varying parameters. Further, while a GPRS may be used to acquire predictive designs, other machine learning algorithms may be used also to acquire predictive designs that describe potential errors for the blocks of memory. For example, neural networks or other machine learning algorithms may be used. When the plurality of memory elements have been characterized, the method 1500A ends 1508.

FIG. 15B depicts a method 1500B for the characterization of a memory element. As illustrated, the method 1500B begins at 1518 and proceeds at 1520 where a memory element is characterized. The characterization 1520 may be an example method of characterization 1504 associated with method 1500A where a test is performed to characterize the performance of multiple memory elements. As illustrated method 1500B may perform multiple program erase cycles on the blocks of memory on a memory element. As the method 1500B performs the multiple program erase cycles, the method 1500B may also check for any errors 1522 that may arise in a block of memory on the memory element. If no errors occur, the method 1500B proceeds with characterizing 1520 the memory element. If an error occurs, the method 1500B proceeds at 1524, where parameter values are saved. As described above, parameter values may include a program loop count, applied currents, applied voltages, program and read temperatures, bit error rate values, cell voltage distributions, program voltages, and the like. In certain embodiments, when the parameter values are saved after an error occurs, the method 1500B recommences at 1520, where the method 1500B may perform characterization on blocks in the memory element that have yet to experience an error. Further, once parameter values are saved for the memory element, the method 1500B ends.

When a memory element is characterized, a memory element similar to the memory element that was characterized may be used to store data for a host device. FIG. 15C illustrates a method 1500C for using a memory element in a user device. Method 1500C proceeds at 1530, where firmware containing the memory elements is mounted within a user device. When the firmware containing the memory element is operational within a user device, during runtime, method 1500C proceeds at 1532, where parameters may be tracked for the memory device. For example, the controller may track parameters that potentially represent the state of the memory device. In at least one embodiment, the controller may track available parameters representing the state of the memory device. In an alternative embodiment, the controller may track parameters as directed by the learned block behavior for the memory device described above with respect to learned block behavior 1506 in FIG. 15A. Further, the controller may also apply weights to the different parameters that are tracked.

When the controller is tracking parameters for the memory elements, method 1500C proceeds at 1534, where logical groups are formed based on a predicted block behavior. For example, a controller may use a model for block behavior produced during the characterization of similar memory elements to predict the likelihood that a block may experience errors. If separate blocks of memory have similar likelihoods of experiencing errors and are predicted to experience certain types of errors, the controller may group these similar blocks together into logical groups called metablocks. When the blocks are grouped together into metablocks, the method 1500C proceeds at 1536, where the firmware continues execution. As firmware continues execution, the controller may continue to track parameters during the run time of the memory elements. Further, the controller may also continue to modify block formations based on predicted block behavior and the tracked parameters. As the blocks may be arranged based on predicted errors, the portion of memory on the memory element dedicated for error correction may be different for different metablocks according to the likelihood of errors and the predicted type of errors.

In various embodiments, a means for predicting errors in a plurality of regions of non-volatile memory array may include a test module 1202, a characterization module 1204, a program/erase cycle module 1308, an error characterization component 150, a characterization device 1002, an element test device 1004, a state machine 222, an on-die controller 220, a device controller 126, a device driver, other logic hardware and/or other executable code stored on a computer readable storage medium. Other embodiments may include similar or equivalent means for predicting errors in the plurality of regions.

In various embodiments, a means for assigning a plurality of regions to logical groups based on predicted errors may include an allocation module 1206, an error characterization component 150, a state machine 222, an on-die controller 220, a device controller 126, a device driver, other logic hardware and/or other executable code stored on a computer readable storage medium. Other embodiments may include similar or equivalent means for assigning a plurality of regions to logical groups based on predicted errors.

In various embodiments, a means for correcting errors in a plurality of regions of a non-volatile memory array based on predicted errors for logical groups may include an error correction module 1314, an allocation module 1206, an error characterization component 150, a state machine 222, an on-die controller 220, a device controller 126, a device driver, other logic hardware and/or other executable code stored on a computer readable storage medium. Other embodiments may include similar or equivalent means for correcting errors in a plurality of regions of a non-volatile memory array based on predicted errors for logical groups.

In various embodiments, a means for performing a plurality of program/erase cycles to a plurality of non-volatile memory arrays may include a program/erase cycle module 1308, a test module 1202, an element test device 1004, an error characterization component 150, a state machine 222, an on-die controller 220, a device controller 126, a device driver, other logic hardware and/or other executable code stored on a computer readable storage medium. Other embodiments may include similar or equivalent means for testing configured to perform a plurality of program/erase cycles to a plurality of non-volatile memory arrays.

In various embodiments, a means for using machine learning to predict behavior of a non-volatile memory array may include machine learning module 1310, a characterization module 1204, an error characterization component 150, a characterization device 1002, a state machine 222, an on-die controller 220, a device controller 126, a device driver, other logic hardware and/or other executable code stored on a computer readable storage medium. Other embodiments may include similar or equivalent means for learning configured to use machine learning to predict behavior of a non-volatile memory array.

In various embodiments, a means for identifying operational parameters for a portion of a non-volatile memory array that are associated with predicted errors may include a parameter identification module 1312, a characterization module 1204, an error characterization component 150, in characterization device 1002, a state machine 222, an on-die controller 220, a device controller 126, a device driver, other logic hardware and/or other executable code stored on a computer readable storage medium. Other embodiments may include similar or equivalent means for identifying operational parameters for a portion of a non-volatile memory array that are associated with predicted errors.

In various embodiments, a means for creating logical groups of memory from different regions of a non-volatile memory array may include an allocation module 1306, an error characterization component 150, a state machine 222, an on-die controller 220, a device controller 126, a device driver, other logic hardware and/or other executable code stored on a computer readable storage. Other embodiments may include similar or equivalent means for creating logical groups of memory from different regions of a non-volatile memory array.

In various embodiments, a means for allocating variable volatile memory for error correction data, the means for allocating variable volatile memory associating separate XOR schemes with separate logical groups from separate regions of the non-volatile memory array may include an allocation module 1306, an error characterization component 150, a state machine 222, an on-die controller 220, a device controller 126, a device driver, other logic hardware and/or other executable code stored on a computer readable storage. Other embodiments may include similar or equivalent means for allocating variable volatile memory for error correction data.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   an array of non-volatile memory cells; and
   a controller configured to:
      acquire an error characterization for a region of memory of the array of non-volatile memory cells, the error characterization indicating one or more types of errors to which the region of memory is susceptible;
      assign the region of memory to a logical group based on the error characterization, the logical group comprising a plurality of regions of memory of the array of non-volatile memory cells; and
      service a write request by striping data across multiple regions of memory assigned to the logical group.

2. The apparatus of claim 1, wherein the logical group comprises memory allocated for error correction, a size of the memory allocated for error correction being based on the error characterization.

3. The apparatus of claim 2, wherein a second logical group comprises a second memory allocated for error correction, a size of the second memory being based on a second error characterization for the second logical group and different from the size of the memory allocated based on the error characterization.

4. The apparatus of claim 1, wherein the error characterization is based on tests of a plurality of arrays of non-volatile memory cells.

5. The apparatus of claim 4, wherein the tests are based on a plurality of program/erase cycles for the plurality of arrays of non-volatile memory cells.

6. The apparatus of claim 5, wherein the error characterization comprises a machine learning result and the machine learning result predicts behavior of the array of non-volatile memory cells based on a machine learning analysis of the plurality of arrays of non-volatile memory cells during the plurality of program/erase cycles.

7. The apparatus of claim 6, wherein the machine learning result is produced using a genetically programmed response surface.

8. The apparatus of claim 1, wherein acquiring the error characterization comprises identifying operational parameters for the region of memory, the operational parameters corresponding to the one or more types of errors to which the region of memory is susceptible.

9. A method comprising:
    acquiring an error characterization for a region of memory of an array of non-volatile memory cells, the error characterization indicating one or more types of errors to which the region of memory is susceptible;
    assigning the region of memory to a logical group based on the error characterization, the logical group comprising a plurality of regions of memory of the array of non-volatile memory cells; and
    servicing a write request by striping data across multiple regions of memory assigned to the logical group.

10. The method of claim 9, wherein the logical group comprises memory allocated for error correction, a size of the memory allocated for error correction being based on the error characterization.

11. The method of claim 10, wherein a second logical group comprises a second memory allocated for error correction, a size of the second memory being based on a second error characterization for the second logical group and different from the size of the memory allocated based on the error characterization.

12. The method of claim 9, wherein the error characterization is based on tests of a plurality of arrays of non-volatile memory cells.

13. The method of claim 12, wherein the tests are based on a plurality of program/erase cycles for the plurality of arrays of non-volatile memory cells.

14. The method of claim 13, wherein the error characterization comprises a machine learning result and the machine learning result predicts behavior of the array of non-volatile memory cells based on a machine learning analysis of the plurality of arrays of non-volatile memory cells during the plurality of program/erase cycles.

15. The method of claim 14, wherein the machine learning result is produced using a genetically programmed response surface.

16. The method of claim 9, wherein acquiring the error characterization comprises identifying operational parameters for the region of memory, the operational parameters corresponding to the one or more types of errors to which the region of memory is susceptible.

17. An apparatus comprising:
    means for acquiring an error characterization for a region of memory of an array of non-volatile memory cells, the error characterization indicating one or more types of errors to which the region of memory is susceptible;
    means for assigning the region of memory to a logical group based on the error characterization, the logical group comprising a plurality of regions of memory of the array of non-volatile memory cells; and
    means for servicing a write request by striping data across multiple regions of memory assigned to the logical group.

18. The apparatus of claim 17, wherein the logical group comprises memory allocated for error correction, a size of the memory allocated for error correction being based on the error characterization.

19. The apparatus of claim 18, wherein a second logical group comprises a second memory allocated for error correction, a size of the second memory being based on a second error characterization for the second logical group and different from the size of the memory allocated based on the error characterization.

20. The apparatus of claim 17, wherein the error characterization is based on tests of a plurality of arrays of non-volatile memory cells.

* * * * *